(12) United States Patent
Chang et al.

(10) Patent No.: US 11,575,057 B2
(45) Date of Patent: Feb. 7, 2023

(54) SOLAR CELL AND METHOD FOR MANUFACTURING THE SAME, AND SOLAR CELL PANEL

(71) Applicant: LG ELECTRONICS INC., Seoul (KR)

(72) Inventors: Jae Won Chang, Seoul (KR); Hyun Jung Park, Seoul (KR); In Do Chung, Seoul (KR); Ji Soo Ko, Seoul (KR)

(73) Assignee: SHANGRAO JINKO SOLAR TECHNOLOGY DEVELOPMENT CO., LTD, Jiangxi Province (CN)

( * ) Notice: Subject to any disclaimer, the term of this patent is extended or adjusted under 35 U.S.C. 154(b) by 512 days.

(21) Appl. No.: 16/704,896

(22) Filed: Dec. 5, 2019

(65) Prior Publication Data

US 2020/0185556 A1 Jun. 11, 2020

(30) Foreign Application Priority Data

Dec. 5, 2018 (KR) .................... 10-2018-0155200

(51) Int. Cl.
*H01L 31/048* (2014.01)
*H01L 31/0468* (2014.01)
*H01L 31/0224* (2006.01)

(52) U.S. Cl.
CPC .... *H01L 31/0481* (2013.01); *H01L 31/02245* (2013.01); *H01L 31/0468* (2014.12)

(58) Field of Classification Search
CPC ............. H01L 31/0481; H01L 31/0468; H01L 31/02245
See application file for complete search history.

(56) References Cited

U.S. PATENT DOCUMENTS

| | | | |
|---|---|---|---|
| 2012/0060912 A1* | 3/2012 | Cho | H01L 31/0682 257/E21.174 |
| 2014/0264191 A1* | 9/2014 | Rantala | H01L 31/022425 427/58 |
| 2015/0129037 A1* | 5/2015 | Nam | H01L 31/056 136/252 |
| 2017/0155007 A1* | 6/2017 | Terashita | H01L 31/0747 |

FOREIGN PATENT DOCUMENTS

| | | |
|---|---|---|
| EP | 2 312 641 A1 | 4/2011 |
| EP | 2 871 682 A1 | 5/2015 |
| EP | 3 125 302 A1 | 2/2017 |
| KR | 10-2016-0063861 A | 6/2016 |

* cited by examiner

*Primary Examiner* — Jayne L Mershon
(74) *Attorney, Agent, or Firm* — Tarolli, Sundheim, Covell & Tummino LLP

(57) ABSTRACT

Discussed is a solar cell including a semiconductor substrate, a conductive region disposed in the semiconductor substrate or over the semiconductor substrate, and an electrode electrically connected to the conductive region. The electrode includes a first electrode part and a second electrode part disposed over the first electrode part. The second electrode part includes a particle connection layer formed by connecting a plurality of particles including a first metal and a cover layer including a second metal different from the first metal and covering at least the outside surface of the particle connection layer.

15 Claims, 17 Drawing Sheets

(a)                                  (b)

SOLAR CELL AND METHOD FOR MANUFACTURING THE SAME, AND SOLAR CELL PANEL

CROSS-REFERENCE TO RELATED APPLICATION

This application is based on and claims priority under 35 U.S.C. 119 to Korean Patent Application No. 10-2018-0155200 filed on Dec. 5, 2018, which is incorporated herein by reference for all purposes as if fully set forth herein

BACKGROUND OF THE INVENTION

Field of the Invention

The present disclosure relates to a solar cell and a method of fabricating the same, and a solar cell panel, and more particularly, to a solar cell having an improved structure and a method of fabricating the same, and a solar cell panel.

Related Art

A solar cell can be fabricated by forming various layers and electrodes based on the design. However, solar cell efficiency can be determined by the design of such various layers and electrodes. Low efficiency needs to be overcome for the commercialization of a solar cell. Accordingly, various layers and electrodes are required to be designed to maximize efficiency of a solar cell.

In a conventional technology, a process of forming an electrode in a solar cell is performed using processes, such as printing, plating and sputtering. However, there is a limit to efficiency of a solar cell and a reduction of a detect rate because conventional processes are used for an electrode without any change for only convenience of the process as described above.

If an electrode is formed using only a printing process, however, a paste for forming the electrode can penetrate an insulating film and a heat treatment process is necessary at a high temperature at which metal particles within the paste can be sintered. A solar cell can be damaged if the characteristics of the solar cell are undesirably changed or severe due to glass frit included in the paste for the heat treatment process at a high temperature and the penetration of the insulating film.

Furthermore, a plating solution needs to be used if an electrode is formed using a plating process. A solar cell can be damaged if the characteristics of the solar cell are undesirably changed or severe due to the plating solution. Furthermore, a process becomes complicated because a seed layer needs to be separately formed prior to the plating process so that plating is performed on only a desired portion. Furthermore, an unwanted portion can be plated if a pin hole, etc. is present in an insulating film.

Furthermore, if an electrode is formed using only a sputtering process, there is a limit to a reduction of resistance because it is difficult to sufficiently increase the thickness of the electrode.

SUMMARY OF THE INVENTION

The disclosure provides a solar cell capable of improving excellent characteristics and efficiency by improving the structure of an electrode and a method of fabricating the same.

More specifically, the disclosure provides a solar cell capable of simplifying a fabrication process while improving full density and efficiency by materializing the stack structure and forming process of an electrode and thus reducing resistance of the electrode, and a method of fabricating the same.

Furthermore, the disclosure provides a solar cell panel having excellent output, excellent stability and a low detect rate, including a solar cell having excellent characteristics and efficiency.

A solar cell according to an embodiment of the disclosure includes an electrode including a first electrode part and a second electrode part located over the first electrode part. In this case, the first electrode part and the second electrode part can be formed by different processes or can have different thicknesses, different characteristics, different shapes, etc. The first electrode part can be configured with a sputtering layer formed by sputtering. The second electrode part can be configured with a printing layer located over the first electrode part and formed by printing. The second electrode part can include different first metal and second metal. The second electrode part can include a particle connection layer formed by connecting a plurality of particles including the first metal and a cover layer including the second metal different from the first metal and covering at least the outside surface of the particle connection layer. Furthermore, the solar cell can further include a semiconductor substrate and a conductive region which is located in the semiconductor substrate or over the semiconductor substrate and in which the electrode is located.

The first metal can have a specific resistance equal to or lower than the material of the first electrode part. The second metal can have a smaller ionization tendency or reactivity of metal than the first metal, thus being capable of preventing the oxidization of the first metal.

The second metal can include a solder material having a lower melting point than the first metal.

The first metal can include at least one of copper, silver, aluminum, or gold, and the second metal can include at least one of tin, chrome, manganese, molybdenum or nickel.

The first metal can include copper, and the second metal can include tin.

The second electrode part can configure the outermost layer of the electrode. The second electrode part can have smaller density than the first electrode part.

A ratio of the thickness of the second electrode part to the thickness of the first electrode part can be 10 or more.

The first thickness of the particle connection layer can be greater than the second thickness of the cover layer at a portion where the particle connection layer is located on the outside surface of the particle connection layer.

A ratio of the second thickness to the first thickness can be 0.04 to 0.2.

The thickness of the cover layer can be greater than a surface roughness of the outside surface of the particle connection layer.

A surface roughness of the outside surface of the cover layer can be smaller than that of the outside surface of the particle connection layer.

The width of the second electrode part can be equal to or smaller than that of the first electrode part.

The second electrode part can be formed on a surface of the first electrode part located opposite the semiconductor substrate, but need not be formed on the side of the first electrode part extended in a direction that intersects the semiconductor substrate.

The first electrode part can include a first electrode layer including a refractory metal, a second electrode layer located over the first electrode layer and having lower resistance than the first electrode layer, a third electrode layer, located over the second electrode layer to function as a diffusion barrier, and a fourth electrode layer located over the third electrode layer and including tin or a nickel-vanadium alloy. The second electrode part can be located in such a way as to come into contact with the fourth electrode layer.

The first electrode layer can include titanium. The second electrode layer can include aluminum. The third electrode layer can include titanium. The fourth electrode layer can include a nickel-vanadium alloy.

The conductive region can include a first conductive region located on one surface of the semiconductor substrate and having a first conductive type, and a second conductive region positioned at a location different from the first conductive region on the one surface of the semiconductor substrate and having a second conductive type. The electrode can include a first electrode connected to the first conductive region and a second electrode connected to the second conductive region. At least one of the first electrode and the second electrode can include the first electrode part and the second electrode part.

In a method of fabricating a solar cell according to an embodiment of the disclosure, an electrode is formed by forming a first electrode part and a second electrode part using different processes. The first electrode part can be configured with a sputtering layer formed by sputtering. The second electrode part can be configured with a printing layer located over the first electrode part and formed by printing. The method of fabricating a solar cell can include forming a conductive region in the semiconductor substrate or over the semiconductor substrate before forming the electrode and forming the electrode electrically connected to the conductive region.

In forming the second electrode part, a paste including a particle, including a core layer including a first metal and a coating layer coated on the core layer and including a second metal different from the first metal, can be used. Alternatively, in forming the second electrode part, a paste including, a first particle including a first metal and a second particle including a second metal different from the first metal, can be used.

Forming the second electrode part can include coating, on the first electrode part, a paste including a particle including different first metal and second metal, a binder, and a solvent; drying the paste at a first temperature; and heat-treating the dried paste at a second temperature higher than the first temperature and lower than the melting point of the first metal.

The first temperature can be 150° C. or less, and the second temperature can be 450° C. or less.

In forming the second electrode part, a plurality of particles including the first metal can be connected to form a particle connection layer. The second metal can be aggregated on the outside surface of the particle connection layer to form a cover layer covering at least the outside surface of the particle connection layer. Accordingly, the second electrode part including the particle connection layer and the cover layer can be formed.

In forming the first electrode part, one or a plurality of electrode layers forming the first electrode part can be generally formed and then patterned. In forming the second electrode part, the paste can be coated on only a portion corresponding to the first electrode part.

A solar cell panel according to an embodiment of the disclosure can include a solar cell, a wiring part electrically connected to an electrode of the solar cell, a sealant surrounding the solar cell and the wiring part, a first cover member located on one surface of the solar cell over the sealant, and a second cover member located on the other surface of the solar cell over the sealant.

The solar cell panel can further include a connection member located between the second electrode part and the wiring part and electrically and physically connect the electrode part and the wiring part including the solder material.

The second electrode part and the wiring part can come into contact with each other and connected.

In the present embodiment, the electrode includes the first electrode part configured with the sputtering layer and the second electrode part configured with the printing layer. Accordingly, a contact characteristic between the electrode and the conductive region can be excellently implemented by the first electrode part, and resistance can be significantly reduced by the second electrode part. If the second electrode part is configured with the printing layer as described above, the production process of the electrode can be simplified and resistance of the electrode can be effectively reduced because the second electrode part can be formed to a sufficient thickness by a simple process. Meanwhile, the second electrode part includes the particle connection layer basically including the first metal and the cover layer basically including the second metal. Accordingly, damage to the conductive region, a characteristic change, etc. in an electrode forming process can be prevented because the particle connection layer can be formed at a low temperature. Furthermore, the electrical and physical connection characteristics of the particle connection layer can be improved, the oxidization of the particle connection layer can be prevented, and an adhesion characteristic with the wiring part can be improved by the cover layer. Accordingly, efficiency of the solar cell and output of the solar cell panel including the solar cell can be improved.

Furthermore, in the method of fabricating a solar cell according to the present embodiment, the electrode including the first and second electrode parts can be formed through a simple process by forming the second electrode part by the printing of the paste including the first metal and the second metal. Accordingly, the solar cell having excellent efficiency can be fabricated with high productivity. Particularly, in the present embodiment, the second metal can effectively prevent the oxidization of the first metal in the cover layer, that is, the outermost layer connected to the wiring part or the connection member. Accordingly, a conventional plasma process performed prior to the forming of the wiring part or the connection member can be omitted. Accordingly, the process can be simplified, and a problem, such as damage to the electrode or the solar cell, can be fundamentally prevented.

DETAILED DESCRIPTION OF THE EMBODIMENTS

Figure 1:
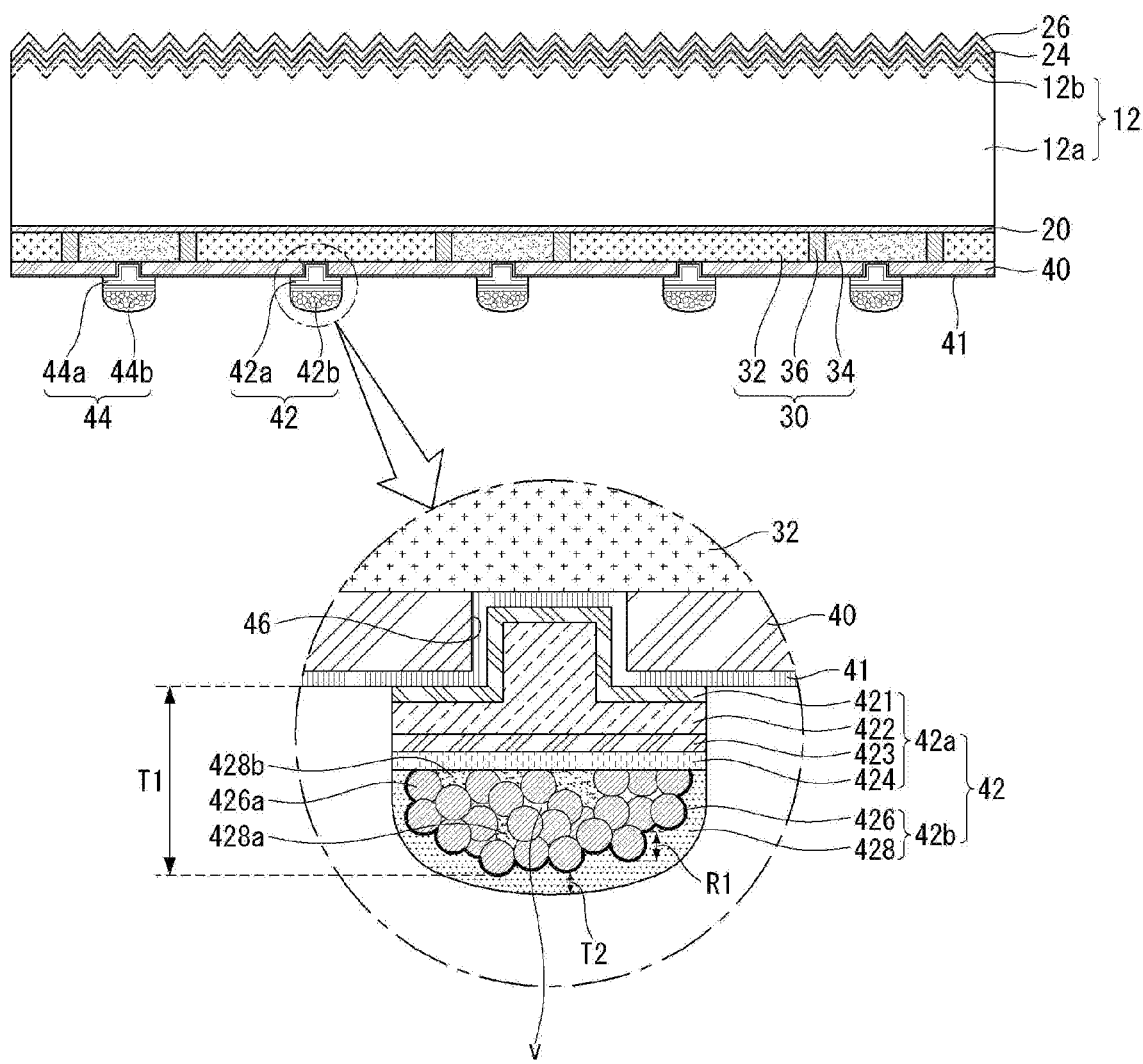
FIG. 1 is a cross-sectional view showing a solar cell according to an embodiment of the disclosure.

Hereinafter, embodiments of the disclosure are described in detail with reference to the accompanying drawings. However, the disclosure is not limited to such embodiments and can be modified in various forms.

In the drawings, a portion not related to the description is not illustrated in order to clarify and briefly describe the disclosure. The same reference numeral is used to denote the same or very similar part through the specification. Furthermore, in the drawings, for a clearer description, a thickness, a width, etc. have been enlarged or reduced, and the thickness, width, etc. of the disclosure are not limited to those shown in the drawings.

Furthermore, in the entire specification, when it is said that one part "includes" the other part, the word "include" will be understood to imply the inclusion of stated parts but not the exclusion of any other parts, unless explicitly described to the contrary. Furthermore, when it is described that one part, such as a layer, film, area, or plate, is "over" or "on" the other part, the one part can be "directly on" the other part or a third part can be present between the two parts. In contrast, when it is described that one part is "directly on" the other part, this means that a third part is not present between the two parts.

Hereinafter, a solar cell and a method of fabricating the same according to embodiments of the disclosure are described in detail with reference to the drawing.

Figure 2:
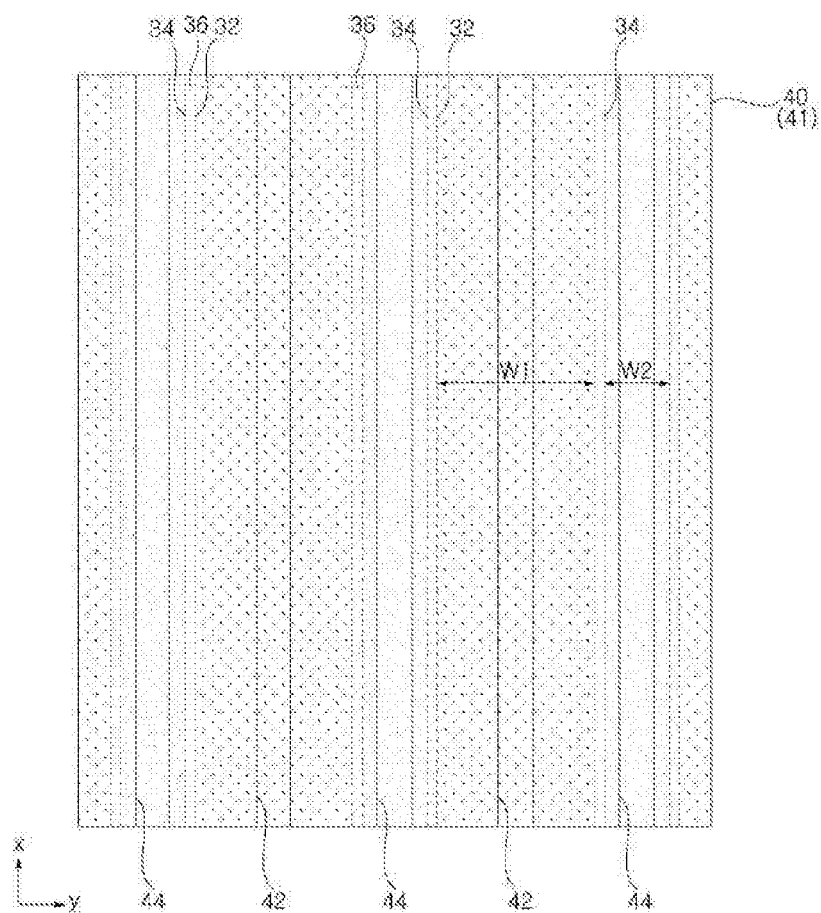
FIG. 2 is a partial back plan view of the solar cell of FIG. 1.

FIG. 1 is a cross-sectional view showing a solar cell according to an embodiment of the disclosure. FIG. 2 is a partial back plan view of the solar cell of FIG. 1.

Referring to FIGS. 1 and 2, a solar cell 10 according to the present embodiment includes a semiconductor substrate 12, a conductive region 32, 34 formed in the semiconductor substrate 12 or over the semiconductor substrate 12, and an electrode 42, 44 electrically connected to the conductive region 32, 34. In this case, the conductive region 32, 34 can include a first conductive region 32 having a first conductive type and a second conductive region 34 having a second conductive type opposite the first conductive type. The electrode 42, 44 can include a first electrode 42 electrically connected to the first conductive region 32 and a second electrode 44 connected to the second conductive region 34. In the present embodiment, at least one of the first and second electrodes 42 and 44 includes a first electrode part 42a, 44a and a second electrode part 42b, 44b located on the first electrode part 42a, 44a. The first electrode part 42a, 44a and the second electrode part 42b, 44b can be formed by different processes, and can have different shapes, different characteristics, different thicknesses, etc. In addition, the solar cell 10 can further include an intermediate film 20, an insulating film 41, a front passivation film 24, an anti-reflection film 26, a back passivation film 40, etc. This is described more specifically.

For example, the semiconductor substrate 12 can include a base region 12a configured with a crystalline semiconductor (e.g., a single crystal or polycrystal (or polycrystalline) semiconductor, for example, single crystal or polycrystal silicon, particularly, single crystal silicon) including a first or second conductive type dopant. The solar cell 10 based on the base region 12a or the semiconductor substrate 12 having a small defect due to high crystallizability or crystallization as described above has excellent electrical characteristics.

A front field region 12b can be located on the front surface of the semiconductor substrate 12. For example, the front field region 12b is a doping region having the same conductive type as the base region 12a and having a higher doping concentration than the base region 12a, and can configure a part of the semiconductor substrate 12, but the disclosure is not limited thereto. Accordingly, the front field region 12b can be a semiconductor layer located separately from the semiconductor substrate 12 or can include various modifications, such as that it is configured with an oxide film having fixed charges without a dopant.

Furthermore, the front surface of the semiconductor substrate 12 can have an anti-reflection structure (e.g., the texturing structure of a pyramid shape configured with the (111) plane of the semiconductor substrate 12) for preventing reflection, thus being capable of minimizing reflection. Furthermore, the back surface of the semiconductor substrate 12 is configured with a mirror-like-polished surface and has smaller surface roughness than the front surface, thus being capable of improving a passivation characteristic. However, the disclosure is not limited thereto and can include various modifications.

The intermediate film 20 can be located between the semiconductor substrate 12 and the conductive region 32, 34 over the back surface of the semiconductor substrate 12. The intermediate film 20 can be generally located (e.g., can come into contact with) the back surface of the semiconductor substrate 12.

The intermediate film 20 can function to passivate a surface of the semiconductor substrate 12. Alternatively, the intermediate film 20 can play as a dopant control role or diffusion barrier for preventing the dopant of the conductive region 32, 34 from being excessively diffused into the semiconductor substrate 12. The intermediate film 20 can include various materials capable of performing the above role, and can be configured with an oxide film, a dielectric film or insulating film including silicon, a nitride oxide film, a carbonized oxide film or an intrinsic amorphous silicon film, for example. For example, if the conductive region 32, 34 is configured with a polycrystal semiconductor, the intermediate film 20 can be a silicon oxide film which can be easily fabricated and through which carriers can be smoothly transmitted. For another example, if the conductive region 32, 34 is configured with an amorphous semiconductor, the intermediate film 20 can be configured with an intrinsic amorphous silicon film.

The thickness of the intermediate film 20 can be smaller than that of the front passivation film 24, the anti-reflection film 26 or the back passivation film 40. For example, the thickness of the intermediate film 20 can be 10 nm or less (e.g., 5 nm or less, more specifically, 2 nm or less, for example, 0.5 nm to 2 nm). This is for sufficiently implementing an effect of the intermediate film 20, but the disclosure is not limited thereto.

A semiconductor layer 30 including the conductive region 32, 34 can be located on (e.g., can come into contact with) the intermediate film 20. More specifically, the first conductive region 32 and the second conductive region 34 can be consecutively formed on the intermediate film 20 and located within the semiconductor layer 30, and can be located on the same plane. Furthermore, a barrier region 36 can be located on the same plane as the first conductive region 32 and the second conductive region 34 between them.

The first and second conductive regions 32 and 34 and the barrier region 36, or the semiconductor layer 30 can have a crystal structure different from that of the semiconductor substrate 12. For example, the first and second conductive regions 32 and 34 and the barrier region 36, or the semiconductor layer 30 can include an amorphous semiconductor, a fine crystal semiconductor, or a polycrystal semiconductor (e.g., amorphous silicon, a fine crystal silicon, or polycrystal silicon). The first conductive region 32 can include a first conductive type dopant. The second conductive region 34 can include a second conductive type dopant. The barrier region 36 can be configured with an intrinsic or undoped semiconductor with which the first and second conductive type dopant are not doped. In this case, the first and second conductive regions 32 and 34 and the barrier region 36, or the semiconductor layer 30 can have high carrier mobility if they have a polycrystal semiconductor. In this case, the first and second conductive regions 32 and 34 and the barrier region 36, or the semiconductor layer 30 can be formed by a simple process if they have an amorphous semiconductor.

In this case, if the base region 12a has a second conductive type, the first conductive region 32 having a conductive type different from that of the base region 12a can function as an emitter region. The second conductive region 34 having the same conductive type as the base region 12a functions a back surface field region. The barrier region 36 can prevent a shunt which can occur when the first conductive region 32 and the second conductive region 34 come into contact with each other by physically isolating them.

In this case, the area (e.g., width) of the first conductive region 32 can be greater than the area (e.g., width) of the second conductive region 34. Accordingly, the first conductive region 32 functioning as an emitter region can be advantageous in photoelectric conversion because it has a wider area than the second conductive region 34 functioning as the back surface field region.

As described above, the first and second conductive regions 32 and 34 are configured with a separate layer different from the semiconductor substrate 12 with the intermediate film 20 interposed between the conductive region and the semiconductor substrate. Accordingly, a loss attributable to a recombination can be minimized compared to a case where a doping region formed by doping a dopant into the semiconductor substrate 12 is used as a conductive region. Furthermore, a process of forming the barrier region 36 can be simplified because the barrier region 36 is configured with an intrinsic or undoped semiconductor.

However, the disclosure is not limited thereto. Accordingly, the intermediate film 20 need not be included. Alternatively, at least one of the first and second conductive regions 32 and 34 can be formed by doping a dopant into the semiconductor substrate 12, and thus can be configured as a doping region that configures a part of the semiconductor substrate 12. Furthermore, the barrier region 36 need not be included or the barrier region 36 can include a different material other than a semiconductor material. Other various modifications are possible.

In this case, if the first or second conductive type dopant is a p type, a 3-group element, such as boron (B), aluminum (Al), gallium (Ga) or indium (In), can be used. If the first or second conductive type dopant is an n type, a 5-group element, such as phosphorus (P), arsenic (As), bismuth (Bi) or antimony (Sb), can be used. For example, one of the first and second conductive type dopants can be boron (B), and the other thereof can be phosphorus (P).

The front passivation film 24 and the anti-reflection film 26 can be located over (e.g., can come into contact with) the front surface of the semiconductor substrate 12. The back passivation film 40 including a contact hole 46 can be located on (e.g., can come into contact with) the conductive region 32,34 or the semiconductor layer 30. The front passivation film 24 and the anti-reflection film 26 can be generally formed on the front surface of the semiconductor substrate 12. The back passivation film 40 can be generally formed on a portion except the contact hole 46 over the semiconductor layer 30. For example, the front passivation film 24, the anti-reflection film 26, or the back passivation film 40 need not include a dopant so that it can have an excellent insulating characteristic, an excellent passivation characteristic, etc.

For example, the front passivation film 24, the anti-reflection film 26 or the back passivation film 40 can have a single film selected from a group consisting of a silicon nitride film, a silicon nitride film containing hydrogen, a silicon oxide film, a silicon oxidization nitride film, an aluminum oxide film, a silicon carbon film, MgF2, ZnS, TiO2 and CeO2 or a multi-layered film structure in which two or more of them have been combined.

Furthermore, the first electrode 42 can be electrically connected to the first conductive region 32 through the contact hole 46. The second electrode 44 can be electrically connected to the second conductive region 34 through the contact hole 46.

In the present embodiment, it has been illustrated that an insulating film 41 is located between the conductive region 32, 34 and the electrode 42, 44 and thus the electrode 42, 44, the insulating film 41 and the conductive region 32, 34 form a metal-insulating layer-semiconductor (MIS) structure.

More specifically, the insulating film 41 is located between the conductive region 32, 34 and the electrode 42, 44 within the contact hole 46 of the back passivation film 40. Accordingly, a reduction of a passivation characteristic which can occur because the back passivation film 40 is removed can be effectively prevented. Furthermore, an interface contact characteristic can be improved compared to a case where the conductive region 32, 34 and the electrode 42, 44 have a direct contact. Furthermore, the insulating film 41 can prevent damage to the conductive region 32, 34 in various processes performed after the contact hole 46 is formed.

In the present embodiment, the insulating film 41 can include a refractory metal oxide formed by a combination of a refractory metal and oxygen. For example, the insulating film 41 can be a refractory metal oxide film made of a refractory metal oxide. The insulating film configured with a silicon oxide has low reflectance, but the insulating film 41 has a high refractive index, so reflectance of a long wavelength can be further improved. Accordingly, light that reaches the back surface of the semiconductor substrate 12 can be effectively reflected. In this case, the insulating film 41 configured with a refractory metal oxide is formed by an atomic layer deposition method not chemical vapor deposition, and can have a high film density and excellent crystallizability or crystallization. Accordingly, the reflection of light can be more effectively improved and contact resistance of the electrode 42, 44 can be significantly reduced by minimizing the absorption of light.

For example, the insulating film 41 can include titanium oxide (TiOx, for example, TiO2) or molybdenum oxide (MoOx, for example, MoO2 or MoO3). For example, the insulating film 41 can be configured with a titanium oxide film or a molybdenum oxide film, and can be configured with a titanium oxide film, particularly. Titanium oxide or molybdenum oxide has high reflectance with respect to light of a long wavelength, and can lower contact resistance of the electrode 42, 44. Particularly, titanium oxide has such excellent effects. More specifically, if the insulating film 41 includes titanium oxide having an anatase phase, reflectance improvement and contact resistance reduction effects can be significantly improved because the insulating film 41 has more excellent crystallizability and a higher refractive index than titanium oxide having another phase. However, the disclosure is not limited thereto, and the insulating film 41 can include titanium oxide having a different phase (e.g., rutile phase).

In this case, the conductive region 32, 34 and the electrode 42, 44 are electrically connected with the insulating film 41 interposed therebetween. Accordingly, the insulating film 41 can be thinly formed so that an electrical connection characteristic between the conductive region 32, 34 and the electrode 42, 44 can be improved. That is, the insulating film 41 can have a smaller thickness than the back passivation film 40, the front passivation film 24 or the anti-reflection film 26, and can have a thickness equal to or smaller than that of the intermediate film 20. Particularly, the insulating film 41 can have a smaller thickness than the intermediate film 20. The reason for this is that the insulating film 41 has only to have a thin thickness to the extent that it does not degrade an electrical connection characteristic.

For example, the thickness of the insulating film 41 can be 1 nm or less (e.g., 0.005 nm to 1 nm). If the thickness of the insulating film 41 exceeds 1 nm, an electrical connection characteristic between the conductive region 32, 34 and the electrode 42, 44 can be slightly reduced. Furthermore, if the thickness of the insulating film 41 is less than 0.005 nm, it can be difficult to generally form the insulating film 41 to a uniform thickness, and an effect by the insulating film 41 need not be sufficient. However, the disclosure is not limited thereto, and can include various modifications.

Figure 3:
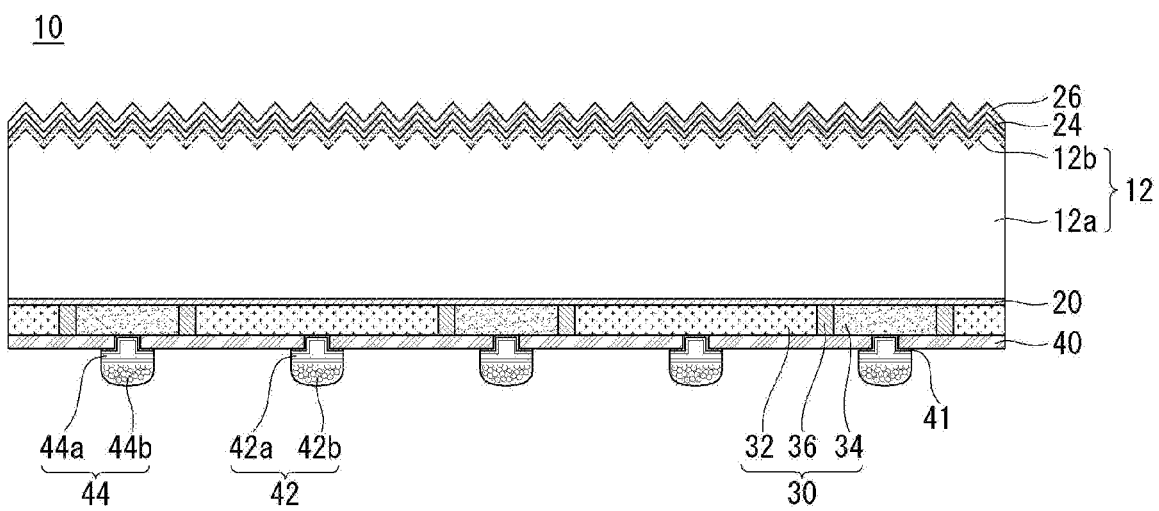
FIG. 3 is a cross-sectional view showing a solar cell according to one modification example of the disclosure.
Figure 4:
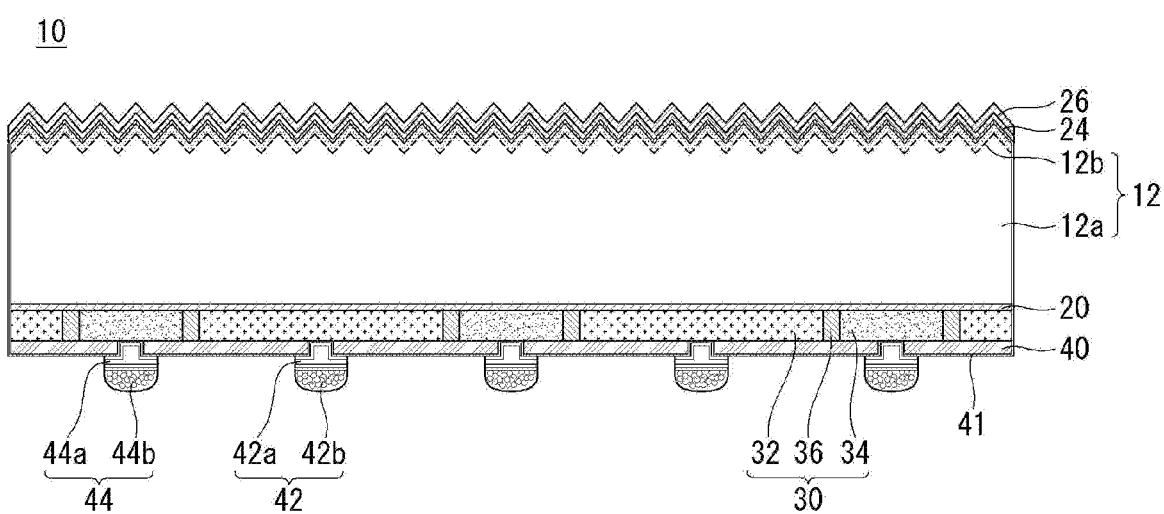
FIG. 4 is a cross-sectional view showing a solar cell according to another modification example of the disclosure.
Figure 5:
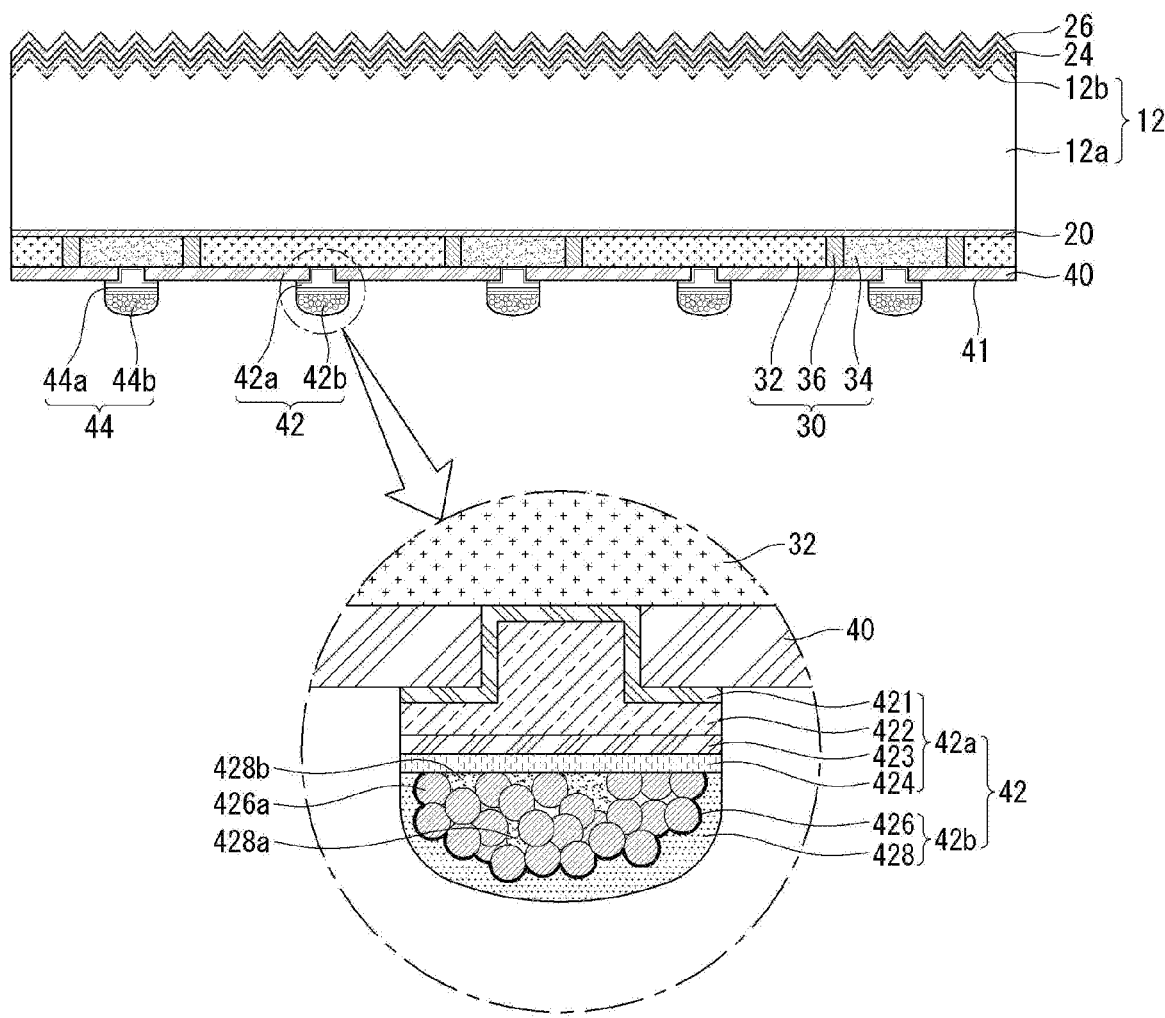
FIG. 5 is a cross-sectional view showing a solar cell according to yet another modification example of the disclosure.

FIG. 1 has illustrated that, for example, the insulating film 41, together with the semiconductor layer 30 exposed by the contact hole 46, is formed generally and consecutively while covering the surface and side of the back passivation film 40. In this case, the insulating film 41 has a very thin thickness, and thus can be formed while having a step, a curve, etc. by the contact hole 46 without any change. However, the disclosure is not limited thereto. As shown in FIG. 3, the insulating film 41 can be patterned when the electrode 42, 44 is patterned, and thus can have a side that is formed only in a portion where the electrode 42, 44 is located and consecutively connected to the side of the electrode 42, 44 (particularly, the side of the first electrode part 42a, 42b). Furthermore, FIG. 1 has illustrated that the insulating film 41 is located only on the side of the back surface of the semiconductor substrate 12 and prevents a change in a reflection characteristic at the front surface, etc. However, as shown in FIG. 4, the insulating film 41 can also be located on the side and/or front surface of the semiconductor substrate 12. Accordingly, when the electrode 42, 44 is patterned, the insulating film 41 can function to protect the side and/or front surface of the semiconductor substrate 12. It has been illustrated the insulating film 41 is located between the front field region 12b and the front passivation film 24, for example, on the front surface of the semiconductor substrate 12. However, the disclosure is not limited thereto, and the insulating film 41 can be located between the front passivation film 24 and the anti-reflection film 26 or on the anti-reflection film 26 depending on the forming sequence of the insulating film 41. Alternatively, as shown in FIG. 5, the insulating film 41 need not be formed, and thus the first and second electrodes 42 and 44 can come into contact with the first and second conductive regions 32 and 34, respectively.

In the present embodiment, the first electrode 42 and the second electrode 44 can be made of a conductive material (e.g., metal). Hereinafter, the stack structure of the first and/or second electrode 42, 44 is described in detail with reference to the enlarged circle of FIG. 1, and the plane structure of the first and second electrodes 42 and 44 is described in detail with reference to FIG. 2. In the enlarged circle of FIG. 1, the first electrode 42 has been enlarged and illustrated, but the second electrode 44 can have the same stack structure. Accordingly, hereinafter, the first or second conductive region 32, 34 is denoted as the conductive region 32, 34, and the first or second electrode 42 connected to the conductive region is denoted as the electrode 42, 44. Furthermore, the first electrode part 42a, 44a of the first and/or second electrode 42, 44 is denoted as the first electrode part 42a, and the second electrode part 42b, 44b of the first and/or second electrode 42, 44 is denoted as the second electrode part 42b.

In the present embodiment, the electrode 42, 44 includes the first electrode part 42a located over the conductive region 32, 34 or located over (e.g., brought into contact with) the insulating film 41 located on the conductive region 32, 34 and the second electrode part 42b located on the first electrode part 42a.

In this case, the first electrode part 42a can be configured with a sputtering layer formed by sputtering. More specifically, the first electrode part 42a can include a plurality of electrode layers 421, 422, 423, and 424. Each of the plurality of electrode layers 421, 422, 423, and 423 can be configured with a sputtering layer. In the present embodiment, the first electrode part 42a can include the first electrode layer 421 located over the conductive region 32, 34 (e.g., coming into contact with the insulating film 41), and can include the second electrode layer 422, the third electrode layer 423 and the fourth electrode layer 424 sequentially on the first electrode layer 421.

The first electrode layer 421 can function to prevent the metal materials of the second to fourth electrode layers 422, 423, and 424 (particularly, the second electrode layer 422) from undesirably reacting with the conductive region 32, 34. In this case, the insulating film 41 can be further located between the conductive region 32, 34 and the first electrode layer 421. The insulating film 41 can function as a barrier to effectively prevent a problem attributable to the diffusion of the metal material.

More specifically, various heat treatment processes are performed during various fabrication processes of the solar cell 10. For example, after an electrode material layer for forming the electrode 42, 44 is formed by physical vapor deposition (PVD), such as sputtering, an annealing process is performed to reduce stress of the electrode material layer and to improve a contact characteristic with the conductive region 32, 34. In a conventional technology, a problem can occur because the semiconductor material of the conductive region 32, 34 is diffused into the second electrode layer 422 and the electrode material of the second electrode layer 422 is diffused toward the conductive region 32, 34 during such a heat treatment process. For example, an electrode material located in the conductive region 32, 34 can easily flow out due to diffusion because an electrode material (particularly, aluminum) of the second electrode layer 422 has a lower melting point than the semiconductor material. Accordingly, a spiking phenomenon in which a small hole or a hole is formed in the conductive region 32, 34 can occur. If a spiking phenomenon occurs in the conductive region 32, 34 as described above, the characteristics of the conductive region 32, 34 can be greatly degraded because a defect occurs in the conductive region 32, 34. In the present embodiment, such a problem can be prevented because the first electrode layer 421 and/or the insulating film 41 is located between the conductive region 32, 34 and the second electrode layer 422.

In this case, the first electrode layer 421 can include the same refractory metal (e.g., titanium or molybdenum) as a refractory metal included in the metal oxide of the insulating film 41. The first electrode layer 421 can be configured with a refractory metal layer included in the metal oxide of the insulating film 41. Particularly, the metal of the first electrode layer 421 and the refractory metal included in the insulating film 41 can be the same. Accordingly, diffusion attributable to a chemical concentration gradient can be effectively prevented because the same refractory metal are included in the first electrode layer 421 and the insulating film 41. For example, the insulating film 41 can include titanium oxide, and the first electrode layer 421 can include titanium. In this case, a stable MIS contact structure can be formed due to low contact resistance and excellent thermal stability.

The second electrode layer 422 located on (e.g., brought into contact with) the first electrode layer 421 can function to improve electrical characteristics because it has low resistance (e.g., lower resistance than the first electrode layer 421). As described above, the second electrode layer 422 can include aluminum (Al), copper (Cu), silver (Ag) or gold (Au). Particularly, the second electrode layer 422 can include aluminum. If the second electrode layer 422 includes aluminum, the side of the second electrode layer 422 and the first electrode part 42a including the second electrode layer 422 can have a cross section according to a desired pattern. In contrast, if the second electrode layer 422 includes copper, an etchant used when the first electrode part 42a is patterned etches the side of the second electrode layer 422 made of copper strongly at a fast speed, so an under-cut can occur in the second electrode layer 422. Accordingly, at least part of the side of the second electrode layer 422 is lower more inside than the first, third and fourth electrode layers 421, 422, 423, and 424. Accordingly, it can be difficult to stably pattern the first electrode part 42a in a desired shape.

The third electrode layer 423 located on (e.g., brought into contact with) the second electrode layer 422 can function as a barrier to prevent the metal material of the second electrode layer 422 from being diffused into the fourth electrode layer 424. Resistance can increase due to an alloy formed by a reaction between the metal material of the second electrode layer 422 and the metal material of the fourth electrode layer 424. The third electrode layer 423 can prevent such resistance. The third electrode layer 423 can have the same material (i.e., refractory metal, for example, titanium, molybdenum, or tungsten) as the first electrode layer 421.

The fourth electrode layer 424 located on (e.g., brought into contact with) the third electrode layer 423 is a portion connected to another solar cell 10 or wiring part (140 in FIG. 9, hereinafter the same) for a connection with the outside, and can include a material having an excellent connection characteristic with the wiring part 140.

The fourth electrode layer 424 can include tin (Sn) or a nickel-vanadium alloy (NiV). Tin or nickel-vanadium alloy has a very excellent adhesion characteristic with the second electrode part 42b. More specifically, if the second electrode part 42b includes tin, a adhesion characteristic between tin of the second electrode part 42b and nickel of the nickel-vanadium alloy is very excellent. Furthermore, the nickel-vanadium alloy has a very high melting point of about 1000° C. or more, and thus has a higher melting point than the first to third electrode layers 421, 422, and 423. Accordingly, the nickel-vanadium alloy is not modified during a bonding process with the wiring part 140 or a process of fabricating the solar cell 10, and can sufficiently function as a capping film for protecting the first to third electrode layers 421, 422, and 423. However, the disclosure is not limited thereto, and the fourth electrode layer 424 can be configured with various conductive materials (e.g., various metals).

The thickness of the first electrode layer 421 can be smaller than that of each of the second electrode layer 422 and the fourth electrode layer 424. More specifically, the thickness of the first electrode layer 421 can be 50 nm or less (e.g., 15 nm or less, for example, 2 nm to 15 nm). The reason for this is that the first electrode layer 421 can sufficiently implement the above-described effect even with a thin thickness.

The second electrode layer 422 can have a greater thickness than the first electrode layer 421, the third electrode layer 423 and/or the fourth electrode layer 424, and can have a thickness of 50 nm to 400 nm, for example. For example, the thickness of the second electrode layer 422 can be 100 nm to 400 nm (more specifically, 100 nm to 300 nm). If the thickness of the second electrode layer 422 is less than 50 nm, the second electrode layer 422 need not play the roles of a barrier layer and a reflection electrode layer. If the thickness of the second electrode layer 422 exceeds 400 nm, a reflection characteristic, etc. is not greatly improved, and a fabrication cost can be increased. If the thickness of the second electrode layer 422 is 100 nm to 300 nm, resistance can be further reduced, and peeling-off attributable to thermal stress can be effectively prevented.

The third electrode layer 423 can have a smaller thickness than each of the second electrode layer 422 and the fourth electrode layer 424. For example, the thickness of the third electrode layer 423 can be 50 nm or less. If the thickness of the third electrode layer 423 exceeds 50 nm, resistance can be relatively increased. In this case, the thickness of the third electrode layer 423 can be 5 nm to 50 nm. If the thickness of the third electrode layer 423 is less than 5 nm, an effect in that a reaction between the third electrode layer 423 and the second electrode layer 422 and the fourth electrode layer 424 is prevented need not be sufficient because the third electrode layer 423 is not uniformly formed between the second electrode layer 422 and the fourth electrode layer 424. Alternatively, the third electrode layer 423 can have the same or similar thickness as the first electrode layer 421 or can have a greater thickness than the first electrode layer 421. However, the disclosure is not limited thereto, and the third electrode layer 423 can have a smaller thickness than the first electrode layer 421.

The fourth electrode layer 424 can have a thickness of a nano level, for example, a thickness of 50 nm to 300 nm. If the thickness of the fourth electrode layer 424 is less than 50 nm, a adhesion characteristic between the fourth electrode layer 424 and the second electrode part 42*b* can be degraded. If the thickness of the fourth electrode layer 424 exceeds 300 nm, a fabrication cost can be increased.

In the present embodiment, the first electrode layer 421, the second electrode layer 422, the third electrode layer 423 and the fourth electrode layer 424 can be formed to come into contact with each other. Accordingly, the characteristics of the first electrode part 42*a* can be improved, and the stack structure of the first electrode part 42*a* can be simplified. For example, in the present embodiment, the first electrode part 42*a* can have a four-layer stack structure including the first to fourth electrode layers 421, 422, 423, and 424. Accordingly, the stack structure of the first electrode part 42*a* can be simplified to the maximum. However, the disclosure is not limited thereto, and the first electrode part 42*a* can have a separate layer between the first to fourth electrode layers 421, 422, 423, and 424 or thereon. Furthermore, the first electrode part 42*a* need not include at least one of the first to fourth electrode layers 421, 422, 423, and 424.

In the present embodiment, the first electrode part 42*a* can be formed by forming a plurality of electrode material layers including the first to fourth electrode layers 421, 422, 423, and 424 by sputtering and then patterning the plurality of electrode material layers. More specifically, after electrode material layers corresponding to the first to fourth electrode layers 421, 422, 423, and 424 are generally sequentially formed to fill the contact hole 46 of the back passivation film 40, the first electrode part 42*a* can be formed by patterning the electrode material layers. If the electrode material layers are patterned as described above, a corresponding material is stacked in the thickness direction of the solar cell 10. Accordingly, the electrode material layers are stacked so that the first electrode layer 421 has a uniform thickness in the entire portion, the second electrode layer 422 has a uniform thickness in the entire portion, the third electrode layer 423 has a uniform thickness in the entire portion, and the fourth electrode layer 424 has a uniform thickness in the entire portion. In this case, the uniform thickness can mean a thickness (e.g., a thickness having a difference within 10%) which can be determined to be uniform when a process error, etc. is considered.

If each of the first to fourth electrode layers 421, 422, 423, and 424 is formed by sputtering as described above, it can be configured with a single metal film (all the remainders other than inevitable impurities are single metal) including a single metal which can be included in each of the electrode layers 421, 422, 423, and 424. Accordingly, each of the first to fourth electrode layers 421, 422, 423, and 424 can include a single metal of 99.9 wt % or more (more specifically, 99.99 wt % or more) which can be included in each of the electrode layers 421, 422, 423, and 424. However, the disclosure is not limited thereto, and content of the single metal of each of the first to fourth electrode layers 421, 422, 423, and 424 can be different depending on a fabrication method, process condition, etc. of each of the first to fourth electrode layers 421, 422, 423, and 424. Furthermore, the material, thickness, stack structure, etc. of each of the first to fourth electrode layers 421, 422, 423, and 424 can also be variously changed.

In the present embodiment, the second electrode part 42*b* configured with a printing layer formed by printing can be located on the first electrode part 42*a* configured with the sputtering layer. The second electrode part 42*b* can come into contact with the first electrode part 42*a* (more specifically, the fourth electrode layer 424), for example. The first electrode part 42*a* configured with the sputtering layer and the second electrode part 42*b* configured with the printing layer can be stably formed with excellent contact resistance. In the present embodiment, the second electrode part 42*b* that configures the outermost layer of the electrode 42, 44 and that is configured with the printing layer has smaller density than the first electrode part 42*a* configured with the sputtering layer.

In this case, the second electrode part 42*b* can include a first metal having specific resistance equal to or lower than that of the material of each of the electrode layers 421, 422, 423, and 424 of the first electrode part 42*a* and a second metal that prevents the oxidization of the first metal. That is, the second metal can have a smaller ionization tendency or reactivity of metal than the first metal. More specifically, the second electrode part 42*b* can include a particle connection layer 426 formed by interconnecting a plurality of particles 426*a* (e.g., bringing the particles into contact with each other) including a plurality of first metals and a cover layer 428 including the second metal and covering at least the outside surface of the particle connection layer 426. In this case, the first metal is for the electrode of the electrode 42, 44 by lowering resistance of the second electrode part 42*b*. The second metal functions to prevent a characteristic change in the oxidization of the first metal and to assist the connection of the particles 426*a* within the particle connection layer 426 made of the first metal. In embodiments, ionization tendency can also refer to ionization energy or ionization potential, for example. Accordingly, reference to a smaller ionization tendency can also mean a smaller ionization energy or ionization potential. In embodiments, the particle connection layer 426 can have a varying thickness where a middle portion is thicker than a peripheral portion, but such is not required. The varying thickness of the particle connection layer 426 can occur over various portions of the particle connection layer 426, such as the middle portion being thinner than the peripheral portion.

In the present embodiment, the second electrode part 42*b* can be formed through dry and curing by coating a paste, including the first metal and the second metal, on the first electrode part 42*a*. Accordingly, a fabrication process can be simplified, and resistance of the second electrode part 42*b* and the electrode 42, 44 including the second electrode part 42*b* can be effectively reduced because the second electrode part 42*b* is formed to a sufficient thickness. A method of fabricating the second electrode part 42*b* using the paste including the first metal and the second metal is described more specifically later with reference to FIGS. 6A to 6C and 7.

In contrast, if an electrode layer including a first metal and an electrode layer formed on the electrode layer and including a second metal for a connection with a wiring part are separately formed, the electrode layers need to be sequentially formed within vacuum equipment in order to prevent the oxidization of the first metal. Accordingly, a process becomes complicated, and there is a difficulty in forming the electrode layers (particularly, the electrode layer including the first metal) to a sufficient thickness. In contrast, in the present embodiment, a process can be simplified and the second electrode part 42b can be formed to a sufficient thickness by applying a printing process using a paste including a first metal and a second metal. Particularly, the second electrode part 42b including the particle connection layer 426 formed by connecting the plurality of particles including the first metal can be formed by heat treatment having a relatively low temperature (e.g., 450° C. or less). A problem in that the characteristics of the conductive region 32, 34 are degraded or the conductive region 32, 34 is damaged in a process of forming the electrode 42, 44 does not occur.

Unlike in the present embodiment, if an electrode is configured with only a printing layer, a contact characteristic between the electrode and the conductive region 32, 34 need not be excellent and the electrode can be easily peeled off from the conductive region 32, 34 because the electrode is configured with only a layer having low density. Furthermore, in order to connect the electrode configured with the printing layer to the conductive region 32, 34, heat treatment at a high temperature (e.g., 700° C. or more) is necessary because a calcinated or sintering process is necessary. Accordingly, the characteristics of the conductive region 32, 34 can be changed because a dopant included in the conductive region 32, 34 is undesirably diffused or activated during a heat treatment process, and a problem, such as that the conductive region 32, 34 is damaged due to a high temperature, can occur.

Furthermore, unlike in the present embodiment, if an electrode is configured with only a sputtering layer, it can be difficult to form the electrode to a sufficient thickness (e.g., exceeding 1 um). If a process time is greatly increased in order to form the electrode to a sufficient thickness, there is a problem in that the characteristics of the conductive region 32, 34 are degraded when the electrode is formed. Accordingly, there is a limit to a reduction in the resistance of the electrode.

Furthermore, unlike in the present embodiment, if an electrode includes only a plating layer, the plating layer needs to be formed through plating after a sputtering layer, a printing layer, etc. are formed. In this case, the density of the plating layer is similar to that of the sputtering layer and higher than that of the printing layer. Accordingly, the density of the plating layer located on the outside is equal to or higher than the sputtering layer, the printing layer, etc. located on the inside. If a plating layer is included as in a conventional technology, the plating layer is also formed on the side of the sputtering layer, the printing layer, etc. and on the insulating layer on the periphery thereof. If a defect, such as a pin hole or a scratch, is present in the back passivation film 40 or the insulating film 41, an unwanted portion can be plated because plating is also performed on the corresponding portion. Furthermore, the back passivation film 40 or the insulating film 41 can be damaged or the characteristics of the back passivation film 40 or the insulating film 41 can be degraded because a plating solution used in the plating process is acid or alkali. Accordingly, a passivation characteristic can be degraded, and an open voltage of the solar cell 10 can be lowered because the leakage current occurs. If various forms of electrode parts are mixed and used as described above as in the conventional technology, the density of an electrode part forming the outermost layer can be equal to or higher than that of an electrode part located under the electrode part forming the outermost layer as described above. Accordingly, this is different from present embodiment in which a printing layer having low density is located on the outside and a sputtering layer having high density is located on the inside.

For another example, if both a printing layer and a plating layer are formed, the stability of an electrode is not excellent and it can be difficult for the wiring part 140 to be stably attached to the electrode because the height of the electrode is too high. Particularly, as in the present embodiment, in the structure in which both the electrodes 42 and 44 are located on one side (i.e., the back surface) of the semiconductor substrate 12 and the wiring part 140 is extended in a direction that intersects with the electrodes 42 and 44 and needs to be connected to only a desired one of the electrodes 42 and 44 and should not be connected to the other of the electrodes 42 and 44, it can be difficult for the wiring part 140 to be stably attached to an electrode in which both a printing layer and a plating layer are formed. For reference, there is a poor possibility that a sputtering layer is technically formed on a plating layer, which is not advantageous in terms of the process.

In the present embodiment, as described above, the second electrode part 42b can be configured with a printing layer and the second electrode part 42b can be located on only the first electrode part 42a when the printing layer is formed. The printing layer can be formed only in a portion in the state having a pattern using a mask. Accordingly, a problem, such as a leakage current, a reduction in the passivation characteristic or a drop of an open voltage which can occur because an electrode is formed in an unwanted portion, can be fundamentally prevented by the printing layer.

More specifically, the first metal included in the particle connection layer 426 can have low specific resistance. For example, copper, silver, aluminum, or gold can be used as the first metal, but titanium (Ti) having high specific resistance need not be used as the first metal. Particularly, the first metal can be made of copper having very low specific resistance and a low price.

Furthermore, the second metal can be a metal capable of preventing the oxidization of the first metal or the particle connection layer 426. For example, the second metal can include tin, chrome (Cr), manganese (Mn), molybdenum (Mo), nickel (Ni), etc. In this case, if the second metal has a lower melting point than the first metal, the second metal easily melts and aggregates in a heat treatment process, thereby being capable of stably forming the cover layer 428 on the outside surface. Furthermore, the second metal functions to physically and electrically connect the particles 426a including the first metal. Furthermore, the second metal can include a material (e.g., a material included in a solder material) which can have an excellent contact characteristic between the second metal and the wiring part 140 or a connection member (CP in FIG. 9, hereinafter the same) for a connection with the wiring part 140. Particularly, the second metal can include the same material as that included in the wiring part 140 or the connection member CP, thus being capable of significantly improving a contact characteristic or adhesion characteristic with the wiring part 140. If the second metal includes tin, the second metal is made of a material, which effectively prevents the oxidization of the first metal, has a lower melting point than the first metal, and is included in the wiring part 140 or the connection member CP. Accordingly, all the above-described effects can be effectively implemented.

The particle connection layer 426 includes a plurality of particles including the first metal having low specific resistance, and can function to lower resistance of the electrode 42, 44. The particle connection layer 426 can be a layer formed by a plurality of particles which is hardened at a lower melting point than the first metal and then aggregated and connected (e.g., cross-linked) in the thickness direction and/or plane direction of the electrode 42, 44. For example, the plurality of particles of the particle connection layer 426 can be physically and electrically connected by a direct contact or can be physically and electrically connected through the cover layer 428 or the remaining portions 428a and 428b, or a binder between the plurality of particles or over the plurality of particles. The particle connection layer 426 includes layers interconnected by hardening. Accordingly, in heat treatment for forming the particle connection layer 426, the first metal does not melt to a melting point or more and is not sintered. Accordingly, a necking phenomenon in which a part of the particles is deformed and combined does not occur. Accordingly, the plurality of particles 426b having an approximately spherical shape remains in the state in which they have been brought into contact with each other and connected, and thus a shape of a curved surface having uneven curves along a surface of portions of the plurality of particles 426a is formed on the outside surface of the particle connection layer 426 (i.e., a surface not coming into contact with the first electrode part 42a or a surface covered by the cover layer 428). For example, the outside surface of the particle connection layer 426 can have a shape of a curved surface having a plurality of concave parts corresponding to the portions of the approximate spherical form.

For example, the plurality of particles 426a can have an average particle size of 1 um or more (e.g., 1 um to 20 um). Alternatively, an average particle size of the plurality of particles 426a can be greater than the thickness of each of the electrode layers 421, 422, 423, and 424 forming the first electrode part 42b. For example, an average particle size of the plurality of particles 426a can be equal to or greater than (particularly, greater than) a total thickness of the first electrode part 42b. If the plurality of particles 426a has an average particle size of a given level or more as described above, resistance of the second electrode part 42b can be effectively reduced. However, the disclosure is not limited thereto.

The cover layer 428 includes the second metal and is formed to cover the outside surface of the particle connection layer 426. If the second metal has a lower melting point than the first metal, it can easily melt at a relatively low temperature and they can be easily aggregated. Accordingly, the second metal can flow out between the plurality of particles 426a including the first metal in a heat treatment process, and is aggregated on the outside surface of the particle connection layer 426 to form a layer form, thereby being capable of forming the cover layer 428. The cover layer 428 can be formed to generally and consecutively cover the outside surface of the particle connection layer 426. Accordingly, the cover layer 428 can effectively function to prevent a characteristic change (e.g., oxidization), etc. in the particle connection layer 426 and to protect the particle connection layer 426. Furthermore, if the second metal configuring the cover layer 428 is includes a material included in a solder material, a contact characteristic with the wiring part 140, etc. can be improved.

In this case, the cover layer 428 can be formed to fill the space between the plurality of particles 426a configured with the first metal. Furthermore, the remaining portions 428a and 428b including the same second metal as the cover layer 428 can be separated from the cover layer 428, and can be further located between the plurality of particles 426a or on a boundary surface neighboring the first electrode part 42a. The remaining portions 428a and 428b can include the first remaining portion 428a separated from the cover layer 428 and located between the plurality of particles 426a and the second remaining portion 428b partially formed on a boundary surface neighboring the first electrode part 42a and having a smaller thickness than the cover layer 428.

In the present embodiment, the second electrode part 42b can have a greater thickness than the first electrode part 42a. The second electrode part 42b is a layer for reducing resistance of the electrode 42, 44 and can be formed to a sufficient thickness in order to effectively lower resistance. For example, a ratio of the thickness (e.g., average thickness) of the second electrode part 42b to the thickness (e.g., average thickness) of the first electrode part 42a can be 10 or more. For example, a ratio of the thickness of the second electrode part 42b to the thickness of the first electrode part 42a can be 10 to 250. If the ratio is 10 or more, a resistance reduction effect by the thickness of the second electrode part 42b can be maximized. If the ratio exceeds 250, there can be a problem in that the structural stability of the electrode 42, 44 is reduced. Alternatively, the thickness of the first electrode part 42a can be 1 um or less (e.g., 600 nm or less), and the thickness of the second electrode part 42b can be 10 um or more (e.g., 10 um to 100 um, more specifically, 10 um to 50 um). An effect by the first electrode part 42a and the second electrode part 42b can be maximized, a fabrication process can be simplified, and the structural stability of the electrode 42, 44 need not be reduced within such a range. Accordingly, the thickness of the second electrode part 42b can be about 10 times or more than the thickness of the first electrode part 42a, for example, about 10 times to about 250 times.

Furthermore, in the second electrode part 42b, the volume ratio of the first metal can be greater than the volume ratio of the second metal, and the thickness of the particle connection layer 426 can be greater than the thickness of the cover layer 428. The reason for this is that the first metal is a major metal for lowering resistance and the amount of the first metal is greater than that of the second metal. For example, the first thickness T1 of the particle connection layer 426 can be 8 um or more (e.g., 10 um or more, 10 um to 100 um, more specifically, 10 um to 50 um), and the second thickness T2 of the cover layer 428 can be 10 um or less (e.g., 2 um to 10 um, for example, 2 to 5 um) at a portion located on the outside surface of the particle connection layer 426. Alternatively, a ratio of the second thickness T2 of the cover layer 428 to the first thickness T1 of the particle connection layer 426 can be 0.04 to 0.2. If the ratio has such a range, a resistance reduction effect by the particle connection layer 426 can be sufficient, oxidization can be prevented by the cover layer 428, and an adhesion characteristic improvement effect with the wiring part 140 can be effective. In this case, the first thickness T1 can be an average thickness or minimum thickness of the particle connection layer 426, and the second thickness T2 can be a minimum thickness of the cover layer 428.

However, the disclosure is not limited thereto, and the thickness of the cover layer 428 can be equal to or greater than the thickness of the particle connection layer 426. Even in such a case, an effect by the first and second metals included in the second electrode part 42b can be implemented. As described above, the outside surface of the particle connection layer 426 can be configured with a curved surface including uneven curves by the shape of the plurality of particles. In this case, the second thickness T2 of the cover layer 428 can be greater than surface roughness R1 of the outside surface of the particle connection layer 426 (i.e., the distance between a portion most protruded from the outside surface of the particle connection layer 426 to the outside and the lowest portion). Accordingly, the cover layer 428 can stably cover the particle connection layer 426. Furthermore, the outside surface of the cover layer 428 can have smaller surface roughness than the outside surface of the particle connection layer 426. Accordingly, a bonding stability with the wiring part 140 can be further improved by reducing surface roughness of the second electrode part 42b in a surface to which the wiring part 140 is bonded.

As described above, the second electrode part 42b is configured with a printing layer formed by printing, and the particle connection layer 426 can also be formed to a sufficient thickness. Accordingly, resistance can be effectively reduced by low specific resistance of the first metal.

Furthermore, the width (e.g., maximum width) of the second electrode part 42b can be equal to or smaller than the width (e.g., maximum width) of the first electrode part 42a. Furthermore, the second electrode part 42b is formed on only a surface of the first electrode part 42a opposite the semiconductor substrate 12 and is not formed on the side of the first electrode part 42a in a direction that intersects with the semiconductor substrate 12 and on the periphery thereof. In the present embodiment, the second electrode part 42b can be stably formed only on a surface of the first electrode part 42a because it is formed by printing. If such a shape is implemented, a problem, such as the leakage current attributable to the second electrode part 42b, can be fundamentally prevented because the second electrode part 42b is not located on the back passivation film 40 and thus the second electrode part 42b is located in the back passivation film 40. For example, a ration of the width (e.g., maximum width) of the second electrode part 42b to the width (e.g., maximum width) of the first electrode part 42a can be 0.5 or more (e.g., 0.8 to 1.0). If the ratio is less than 0.5, a resistance reduction effect by the second electrode part 42b need not be sufficient. If the ratio is 0.8 or more, a resistance reduction effect by the second electrode part 42b can be sufficiently implemented.

In the present embodiment, 100 or more portions (e.g., the first and second electrodes 42 and 44) of the first and second electrodes 42 and 44 including the second electrode parts 42b and 44b extended in one direction (the y-axis direction in the drawing) and including copper and tin as described above (more specifically, the second electrode parts 42b and 44b each including the particle connection layer 426 including copper and the cover layer 428 covering the particle connection layer 426) can be located on one surface of the semiconductor substrate 10. Accordingly, carriers can be stably collected and transmitted because a carrier moving distance can be reduced. In this case, as described above, the thickness of the second electrode part 42b, 44b extended in one direction and including copper and tin (more specifically, the second electrode part 42b, 44b including the particle connection layer 426 including copper and the cover layer 428 covering the particle connection layer 426) or the thickness of the first, second electrode 42, 44 including the second electrode part 42b, 44b can be 10 um or more. However, the disclosure is not limited thereto.

The electrode 42, 44 can be formed to have a greater width than the contact hole 46. This is for reducing resistance of the electrode 42, 44 by sufficiently securing the width of the first, second electrode 42, 44 (i.e., the greatest width of the widths of portions configuring the electrode 42, 44). Accordingly, the electrode 42, 44 (particularly, the first electrode layer 421) can be formed across the insulating film 41 located within (i.e., on the bottom and side) the contact hole 46 and across the insulating film 41 located on the back passivation film 40 neighboring to the contact hole 46. If the insulating film 41 is not included, the electrode 42, 44 (particularly, the first electrode layer 421) can be formed on the conductive region 32, 34 exposed through the inside of the contact hole 46 and on the side and surface of the back passivation film 40 neighboring to the contact hole 46.

In the present embodiment, the first and second electrodes 42 and 44 can include the first electrode parts 42a and 44a and the second electrode parts 42b and 44b, respectively. Accordingly, a process can be simplified because the first electrode parts 42a and 44a and second electrode parts 42b and 44b of the first and second electrodes 42 and 44 are formed in the same process at the same time. However, the disclosure is not limited thereto. Only one of the first and second electrodes 42 and 44 can have the above-described structure, and the other thereof can have a different structure. In addition, the disclosure can include various modifications.

An example of a plane shape of the first conductive region 32, the second conductive region 34, the barrier region 36, and the first and second electrodes 42 and 44 is described in detail below with reference to FIGS. 1 and 2.

Referring to FIGS. 1 and 2, in the present embodiment, each of the first conductive region 32 and the second conductive region 34 is lengthily formed to have a stripe form. The first conductive region 32 and the second conductive region 34 are alternately located in a direction that intersects with a length direction. The barrier region 36 for isolating the first conductive region 32 and the second conductive region 34 can be located between them. Although not illustrated, a plurality of the isolated first conductive regions 32 can be interconnected at an edge on one side, and a plurality of the isolated second conductive regions 34 can be interconnected at an edge on the other side. However, the disclosure is not limited thereto.

In this case, the area of the first conductive region 32 can be greater than that of the second conductive region 34. For example, the area of each of the first conductive region 32 and the second conductive region 34 can be adjusted by making different the width of the region. That is, the width W1 of the first conductive region 32 can be greater than the width W2 of the second conductive region 34. In accordance with this, the width of the first electrode 42 (i.e., each of the first and second electrode parts 42a and 42b of the first electrode 42) can be greater than the width of the second electrode 44 (i.e., each of the first and second electrode parts 44a and 44b of the second electrode 44). However, the disclosure is not limited thereto, and the width of the first electrode 42 (i.e., each of the first and second electrode parts 42a and 42b of the first electrode 42) can be the same as that of the second electrode 44 (i.e., each of the first and second electrode parts 44a and 44b of the second electrode 44).

Furthermore, the first electrode 42 can be formed in a stripe form in accordance with the first conductive region 32, and the second electrode 44 can be formed in a stripe form in accordance with the second conductive region 34. The contact hole 46 can be formed to connect only some of the first and second electrodes 42 and 44 to the first conductive region 32 and the second conductive region 34, respectively. For example, the contact hole 46 can be configured with a plurality of contact holes. Alternatively, each of the contact holes 46 can be formed in the entire length of the first and second electrodes 42 and 44 in accordance with the first and second electrodes 42 and 44. Accordingly, carriers collection efficiency can be improved by maximizing a contact area between the first and second electrodes 42 and 44 and the first conductive region 32 and the second conductive region 34. In addition, the disclosure can include various modifications. Furthermore, although not illustrated, the first electrodes 42 can be interconnected at an edge on one side, and the second electrode 44 can be interconnected at an edge on the other side. However, the disclosure is not limited thereto.

When light is incident on the solar cell 10 according to the present embodiment, electrons and holes are generated by a photoelectric conversion in a pn junction formed between the base region 12a and the first conductive region 32. The generated holes and electrons pass through the intermediate film 20, move to the first conductive region 32 and the second conductive region 34, respectively, and then move to the first and second electrodes 42 and 44. Accordingly, electric energy is generated.

In the solar cell 10 of a back surface electrode structure in which the electrode 42, 44 is formed on the back surface of the semiconductor substrate 12 and an electrode is not formed on the front surface of the semiconductor substrate 12 as in the present embodiment, a shading loss on the front surface of the semiconductor substrate 12 can be minimized. Accordingly, efficiency of the solar cell 10 can be improved. However, the disclosure is not limited thereto. Furthermore, the first and second conductive regions 32 and 34 are configured with separate layers different from the semiconductor substrate 12 because they are formed over the semiconductor substrate 12 with the intermediate film 20 interposed therebetween. Accordingly, a loss attributable to a recombination can be minimized compared to a case where a doping region formed by doping a dopant into the semiconductor substrate 12 is used as a conductive region.

Furthermore, in the present embodiment, at least one of the first and second electrodes 42 and 44 includes the first electrode parts 42a and 44a configured with a sputtering layer and the second electrodes part 42b and 44b configured with a printing layer. Accordingly, the contact characteristic between the electrode 42, 44 and the conductive region 32, 34 can be excellently implemented by the first electrode part 42a, and resistance can be significantly reduced and an adhesion characteristic with the wiring part 140 can be improved by the second electrode part 42b, 44b. If the second electrode part 42b, 44b is configured with a printing layer as described above, the second electrode part 42b, 44b can be formed to a sufficient thickness by a simple process. Accordingly, the production process of the electrode 42, 44 can be simplified, and resistance of the electrode 42, 44 can be effectively reduced.

The second electrode part 42b includes the particle connection layer 426 basically including the first metal and the cover layer 428 basically including the second metal. Accordingly, damage to the conductive region 32, 34 or a characteristic change in the conductive region 32, 34 in a process of forming the electrode 42, 44 can be prevented because the particle connection layer 426 can be formed at a low temperature. Furthermore, the electrical and physical connection characteristics of the particle connection layer 426 can be improved, the oxidization of the particle connection layer 426 can be prevented, and an adhesion characteristic with the wiring part 140 can be improved by the cover layer 428.

Figure 6A:
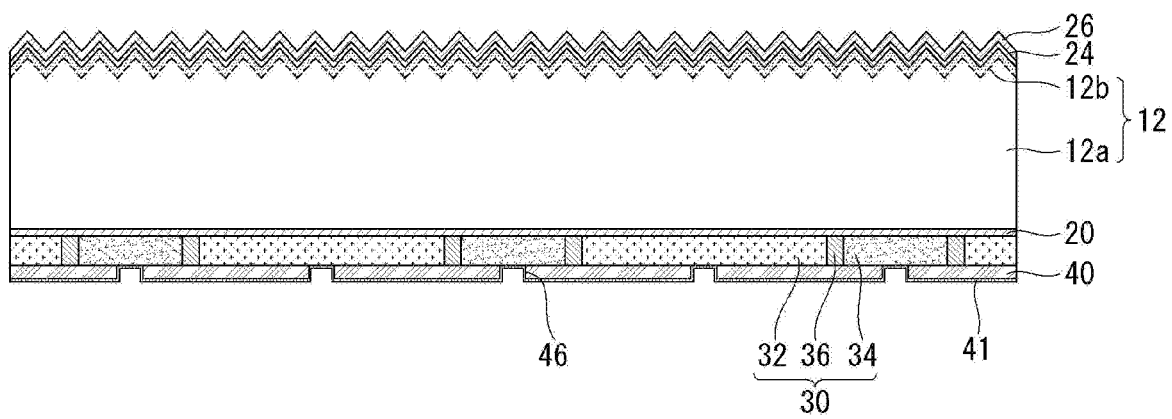
FIGS. 6A to 6C are cross-sectional views showing a method of fabricating a solar cell according to an embodiment of the disclosure.
Figure 6B:
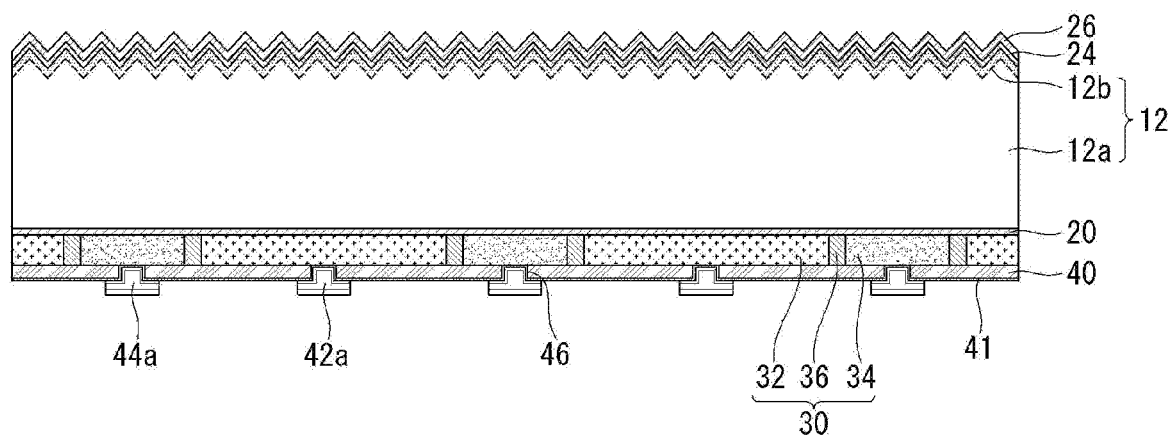
Figure 6C:
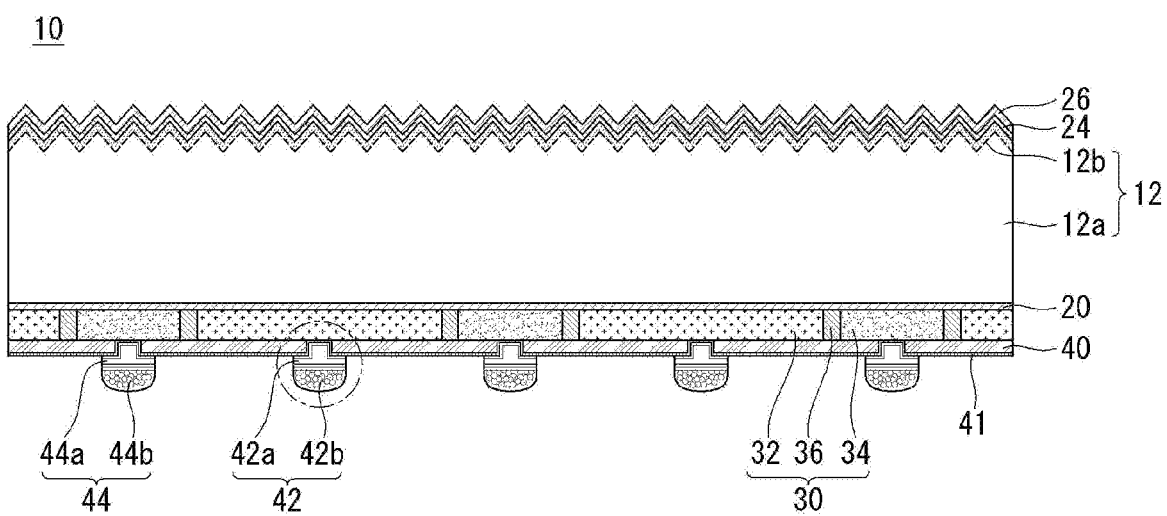
Figure 7:
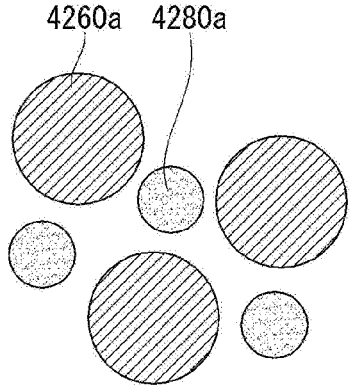
FIG. 7 is a diagram schematically showing the shape of particles included in a paste used for a method of fabricating a solar cell according to an embodiment of the disclosure.

A method of fabricating the solar cell 10 having the above structure is described in detail below with reference to FIGS. 6A to 6C, and 7. FIGS. 6A to 6C are cross-sectional views showing a method of fabricating a solar cell according to an embodiment of the disclosure. FIG. 7 is a diagram schematically showing the shape of particles included in a paste used for a method of fabricating a solar cell according to an embodiment of the disclosure. A detailed description of a portion already described in the above description is omitted, and an undescribed portion is chiefly described in detail.

First, as shown in FIG. 6A, the intermediate film 20, the first conductive region 32, the second conductive region 34, the barrier region 36, the back passivation film 40, the insulating film 41, etc. are formed over the back surface of the semiconductor substrate 12. The front field region 12b, the front passivation film 24, the anti-reflection film 26, etc. are formed over the front surface of the semiconductor substrate 12. In this case, the contact hole 46 has been formed in the back passivation film 40 in accordance with a portion where an electrode (42, 44 in FIG. 6C, hereinafter the same) will be formed.

A forming sequence and forming method of the intermediate film 20, the first conductive region 32, the second conductive region 34, the barrier region 36, the back passivation film 40, the insulating film 41, the front field region 12b, the front passivation film 24, the anti-reflection film 26, etc. can be changed in various ways.

For example, various processes known as the texturing of the semiconductor substrate 12 can be used. The intermediate film 20 or the insulating film 41 can be formed by a thermal growth method or a deposition method (e.g., chemical vapor deposition method (PECVD) or atomic layer deposition (ALD)). The first and second conductive regions 32 and 34 can be formed by doping a dopant into a semiconductor layer formed by a thermal growth method or a deposition method (e.g., a low pressure chemical vapor deposition (LPCVD)). The doping of the dopant can be performed in a process of forming the semiconductor layer or can be performed by a doping process performed after the semiconductor layer is formed. The front field region 12b can be formed by various doping processes. An ion implantation method, a thermal diffusion method or a laser doping method can be performed as the doping process. The front passivation film 24, the anti-reflection film 26 or the back passivation film 40 can be formed by various methods, such as a chemical vapor deposition method, a vacuum deposition method, spin coating, screen printing and spray coating. The contact hole 46 can be formed by various methods, such as laser etching and wet etching.

Next, as shown in FIG. 6B, the first electrode part 42a, 44a of the first, second electrode 42, 44 is formed to fill the contact hole 46. The first electrode part 42a, 44a can be formed by sputtering.

The first electrode part 42a, 44a of the first, second electrode 42, 44 can be formed in such a manner that a plurality of electrode material layers is sequentially and generally formed over the semiconductor substrate 12 and the conductive region 32, 34 (or the insulating film 41 formed on the conductive region) by performing sputtering, plating, etc. on the semiconductor substrate 12 and the conductive region 32, 34 (or the insulating film 41 formed on the conductive region) and the plurality of electrode material layers is then patterned. The patterning method can be performed using an etch solution, an etching paste or dry etching. For example, a resist paste can be coated on a portion where the first electrode part 42a, 44a needs to be formed. The first electrode part 42a, 44a can be patterned by etching the remaining portion using an etch solution. Thereafter, the resist paste is removed. Other various methods are possible.

Next, as shown in FIG. 6C, the second electrode part 42b, 44b is formed to have a pattern having a width equal or smaller than the width of the first electrode part 42a, 44a. The second electrode part 42b, 44b can be formed by printing.

More specifically, the second electrode part 42b, 44b can be formed by coating a paste for forming the second electrode part 42b, 44b on the first electrode part 42a, 44a, drying the paste at a first temperature, and heat-treating the dried paste at a second temperature higher than the first temperature.

The paste for forming the second electrode part 42b can include the particle 426b including different first metal and second metal, a binder, and a solvent. In the present embodiment, the second electrode part 42b, 44b does not include glass frit because it does not require a fire-through that penetrates an insulating film, etc.

The particle 426b included in the paste and including the first metal and the second metal can have various forms. That is, as shown in FIG. 7(a), the particle 426b can include a core layer 4260 including a first metal and a coating layer 4280 coated on the core layer 4260 and including a second metal. In this case, an average thickness of the coating layer 4280 can be smaller than an average diameter of the core layer 4260. Accordingly, the thickness of the cover layer 428 can be smaller than the thickness of the particle connection layer 426. However, the disclosure is not limited thereto. Accordingly, the thickness of the coating layer 4280 can be equal to or greater than an average diameter of the core layer 4260 and/or the thickness of the cover layer 428 can be equal to or greater than the thickness of the particle connection layer 426. Alternatively, as shown in FIG. 7(b), the particle 426b can include a first particle 4260a including a first metal and a second particle 4280a including a second metal. In this case, an average diameter of the second particle 4280a can be smaller than an average diameter of the first particle 4260a and/or the number of second particles 4280a can be smaller than the number of first particles 4260a. Accordingly, the thickness of the cover layer 428 can be smaller than the thickness of the particle connection layer 426. However, the disclosure is not limited thereto. Accordingly, the size or number of the second particle 4260b can be equal to or greater than the size or number of the first particle 4260a and/or the thickness of the cover layer 428 can be equal to or greater than the thickness of the particle connection layer 426.

The binder can include various materials capable of improving the physical and electrical connection characteristics of the particle 426a included in the second electrode part 42b, 44b and an adhesion characteristic with the first electrode parts 42a and 44b (particularly, the fourth electrode layer 424). For example, known polymer resin can be used as the binder. The binder can be removed or need not be removed upon heat treatment and can remain or need not remain on the second electrode part 42b, 44b after heat treatment.

The paste includes a solvent, but the solvent can become volatile upon heat treatment. Accordingly, the solvent need not be included in the second electrode part 42b, 44b or a very small amount of the solvent can be included in the second electrode part 42b, 44b. An organic solvent can be used as the solvent. For example, butyl carbitol acetate (BCA) or cellulose acetate (CA) can be used as the solvent, but the disclosure is not limited thereto.

The paste can be coated on only a portion corresponding to the first electrode part 42a, 44a. For example, the paste for forming the second electrode part 42b, 44b can be coated by screen printing using a mask. However, the disclosure is not limited thereto.

The paste coated on the first electrode part 42a, 44a is dried at a first temperature. The first temperature is higher than room temperature and can be 150° C. or less, but the disclosure is not limited thereto. The first temperature can have a different value. A problem, such as that the paste undesirably flows down, can be prevented by drying the paste. If heat treatment is directly performed without performing the dry step, a problem, such as a crack, can occur due to a temperature difference. Heat treatment for hardening is performed after the fluidity of the paste is reduced by drying the paste at a temperature lower than a heat treatment temperature.

Heat treatment for hardening is performed on the dried paste at a second temperature that is higher than the first temperature and that is lower than the melting point of the first metal (i.e., a higher melting point of the melting points of the first and second metals). In this case, the second temperature can be higher than the melting point of the second metal (i.e., a lower melting point of the melting points of the first and second metals). For example, the second temperature can be 450° C. or less, but the disclosure is not limited thereto. The second temperature can have a different value.

If the heat treatment is performed on the dried paste, the solvent becomes volatile and heat is applied to the first and second metals. When heat is applied to the first metal and the second metal, the first metal is aggregated together, and the second metal is aggregated together.

More specifically, as in FIG. 7(a), the core layer 4260 includes the first metal and the coating layer 4280 includes the second metal, the coating layer 4280 melts and flows out. Accordingly, the particles of the core layer 4260 are aggregated to form the particle connection layer 426. The molten and flowed-out second metal is aggregated on the outside surface of the particle connection layer 426, thus forming the cover layer 428 that covers the particle connection layer 426. As in FIG. 7(b), if the first particle 4260a includes the first metal and the second particle 4280a includes the second metal, the second particle 4280a including the second metal melts and flows out. Accordingly, the first particles 4260a are aggregated to form the particle connection layer 426. The second metal formed by the molten second particle 4280a is aggregated together on the outside surface of the particle connection layer 426, thus forming the cover layer 428 that covers the particle connection layer 426. In this case, if the first metal is copper, copper can effectively function to deliver heat to the second metal because copper is easily aggregated when heat is applied thereto and easily absorbs heat. Accordingly, the second metal can move to the outside surface of the particle connection layer 426 more smoothly and can be aggregated together on the outside surface.

In this case, the particles 426b of the particle connection layer 426 are not sintered, but are brought into contact with each other and aggregated to have conductivity by hardening simply. The binder or the remaining portions 428a and 428b on which the second metal remains can be filled between the particles 426a of the particle connection layer 426 formed by simple hardening as described above. A gap (v in FIG. 1, hereinafter the same) can remain in some portion between the particles 426a. Accordingly, the second electrode part 42b, 44b can have a higher gap ratio than the first electrode part 42a, 44a not having the gap v. The first electrode part 42a, 44a configured with a sputtering layer and the second electrode part 42b, 44b configured with a printing layer can be identified based on such a gap ratio difference. For reference, the first electrode part 42a configured with a sputtering layer and the second electrode part 42b configured with a printing layer can be identified based on a cross-sectional shape or an external surface shape in a microscope photo or can be identified depending on whether a binder is present through component analysis.

In a method of fabricating the solar cell 10 according to the present embodiment, the electrode 42, 44 including the first and second electrode parts 42a and 42b (44a, 44b) can be formed through a simple process by forming the second electrode part 42b, 44b by the printing of the paste including the first metal and the second metal. Accordingly, the solar cell 10 having excellent efficiency can be fabricated with high productivity.

Particularly, in the present embodiment, the second metal can effectively prevent the oxidization of the first metal in the cover layer 428, that is, the outermost layer connected to the wiring part 140 or the connection member CP. In a conventional technology, a plasma process for removing an oxidization layer formed in the electrode 42, 44 is additionally performed before the wiring part 140 or the connection member CP is formed. In the present embodiment, however, the plasma process for removing the oxidization layer can be omitted by preventing oxidization in the outermost layer of the electrode 42, 44 by the second metal. Accordingly, a process can be simplified, and a problem, such as damage to the electrode 42, 44 or the solar cell 10, can be fundamentally prevented.

In the drawing, it has been illustrated that the fabrication of the solar cell 10 is completed by forming the electrode 42, 44 by directly performing heat treatment on the second electrode part 42b, 44b without another process after the paste is dried. Accordingly, it can be advantageous from a viewpoint of a fabrication process because annealing heat treatment for the first electrode part 42a, 44a formed by sputtering and annealing heat treatment for the second electrode part 42b, 44b can be performed at the same time. However, the disclosure is not limited thereto. The heat treatment of the second electrode part 42b, 44b can be performed in various sequences. That is, the heat treatment of the second electrode part 42b, 44b can be performed in a process after a process of fabricating the solar cell 10, for example, in a process of forming the solar cell panel 100. For example, if the annealing heat treatment of the second electrode part 42b, 44b is performed in a reflow process performed after the connection member CP is formed, the number of heat treatment processes can be minimized. In addition, the disclosure can include various modifications.

The solar cell 10 can be connected by the wiring part 140 and sealed by the sealant 130 and the cover members 110 and 120, thereby configuring a solar cell panel 100. A solar cell panel according to an embodiment of the disclosure is described in detail below with reference to FIGS. 8 to 11.

Figure 8:
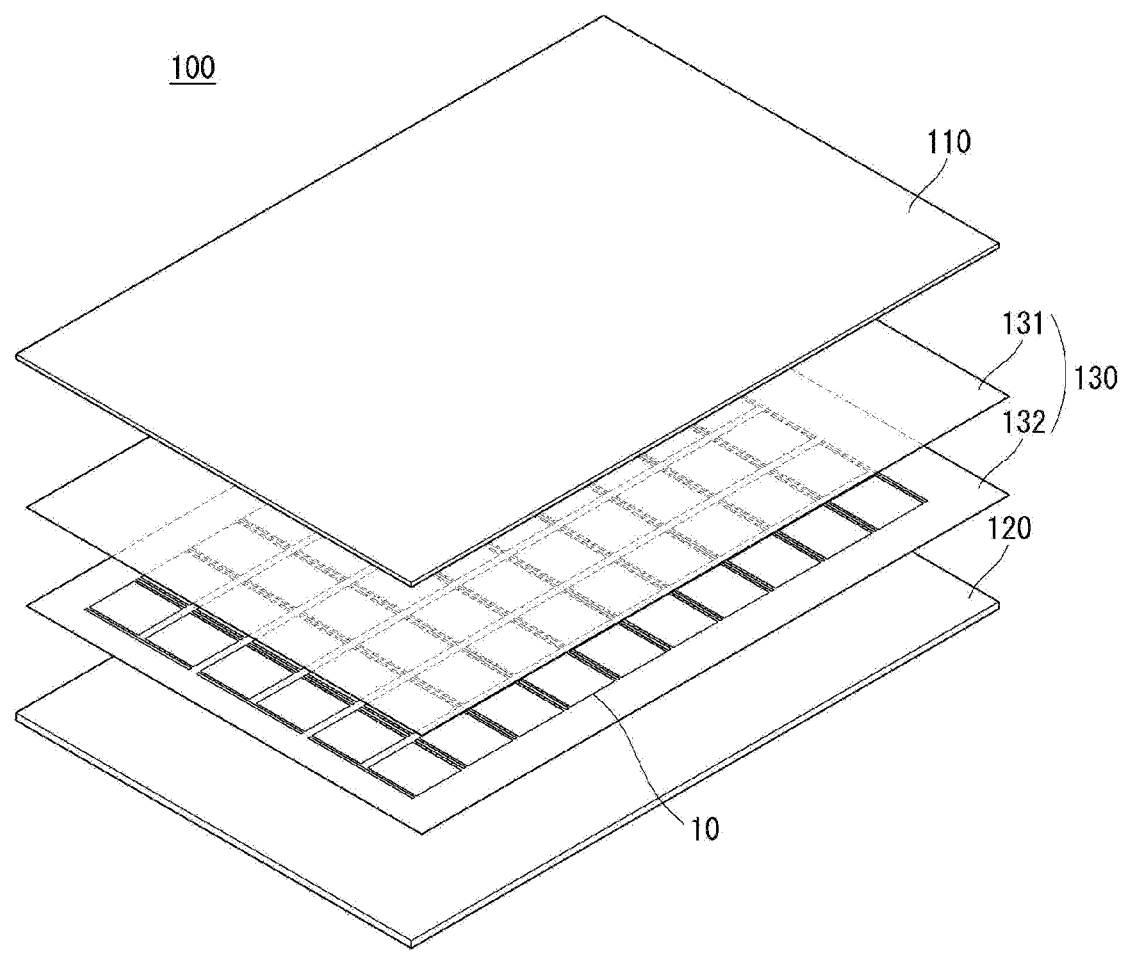
FIG. 8 is an exploded perspective view schematically showing a solar cell panel according to an embodiment of the disclosure.
Figure 9:
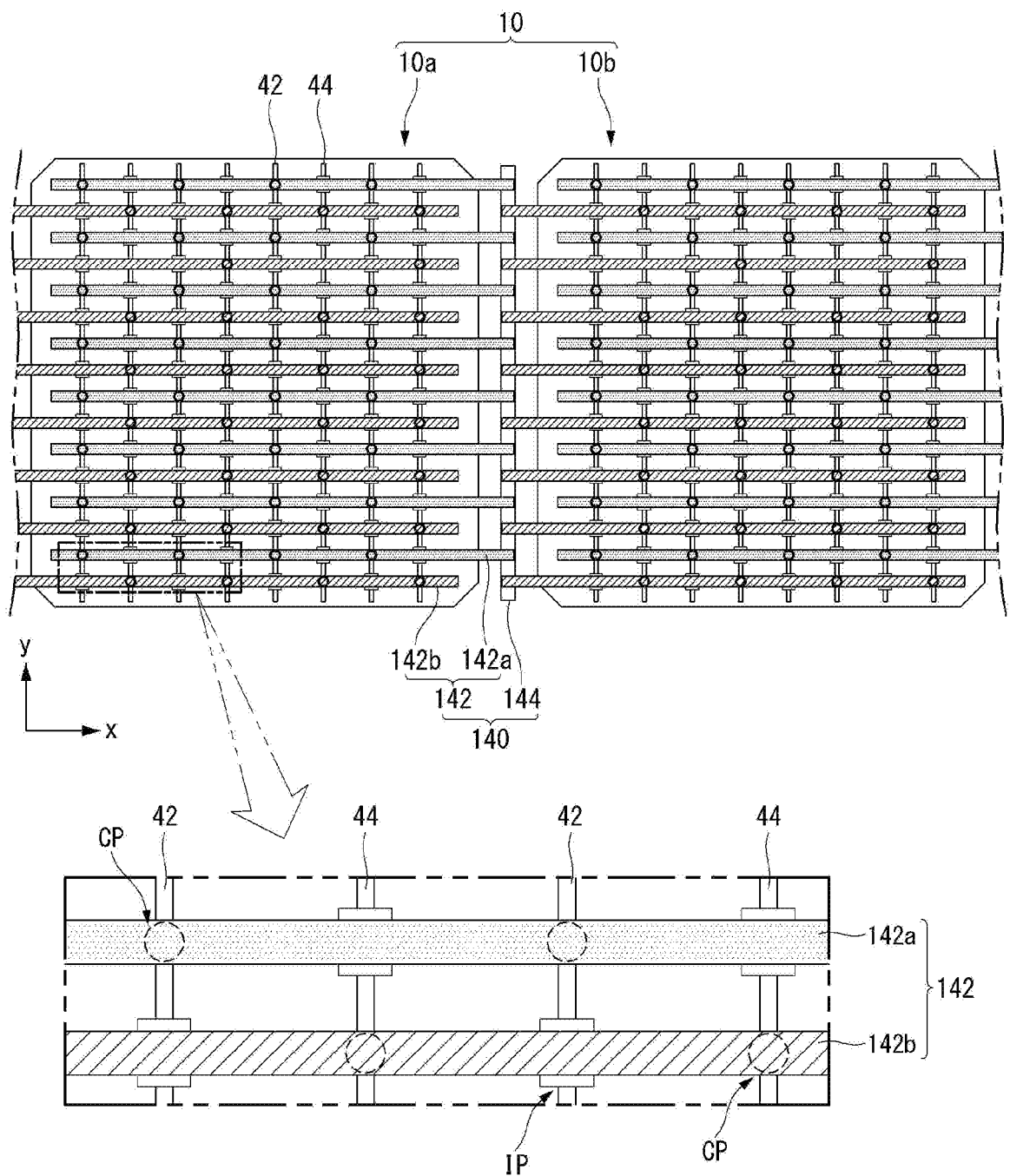
FIG. 9 is a back plan view schematically showing two solar cells included in the solar cell panel of FIG. 8, a connection member, an insulating member, and a wiring part.
Figure 10:
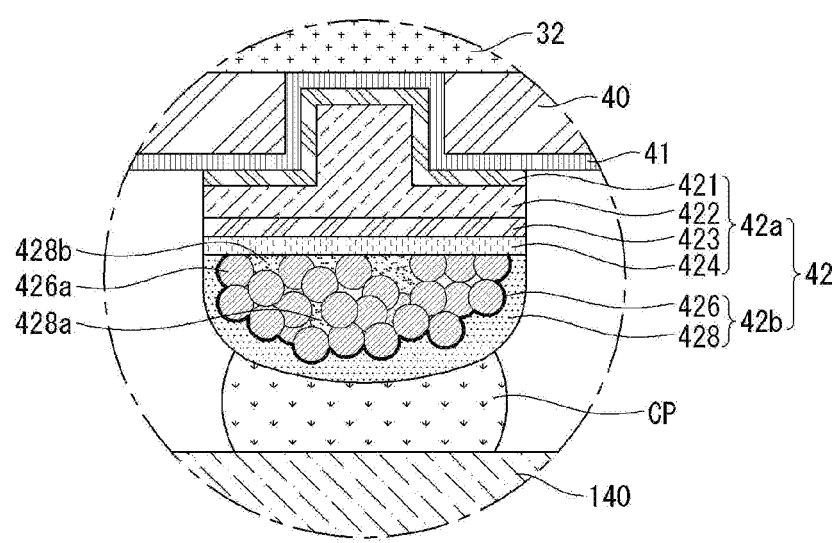
FIG. 10 is a partial cross-sectional view schematically showing the connection structure of the solar cells, connection member and wiring part in the solar cell panel of FIG. 8.

FIG. 8 is an exploded perspective view schematically showing a solar cell panel according to an embodiment of the disclosure. FIG. 9 is a back plan view schematically showing the two solar cells 10 included in the solar cell panel 100 of FIG. 8, the connection member CP and the insulating member IP, and the wiring part 140. FIG. 10 is a partial cross-sectional view schematically showing the connection structure of the solar cell 10, the connection member CP and the wiring part 140 in the solar cell panel 100 of FIG. 8. For a clear and simple illustration, FIG. 9 illustrates only the semiconductor substrate 12 and the first and second electrodes 42 and 44 in relation to the solar cell 10. For a clear distinction, two solar cells 10 that are adjacent to each other can be called solar cells 10a and 10b.

Referring to FIGS. 8 to 10, the solar cell panel 100 according to the present embodiment includes the solar cell 10 and the wiring part 140 electrically connected to the electrodes 42 and 44 of the solar cell 10. Furthermore, the solar cell panel can include the connection member CP that electrically connects the electrodes 42 and 44 and the wiring part 140 between the electrodes 42 and 44 and the wiring part 140. The solar cell panel 100 can further include a sealant 130 for surrounding and sealing the solar cell 10 and the wiring part 140, a first cover member 110 located on one surface (e.g., the front surface) of the solar cell 10 on the sealant 130, and a second cover member 120 located on the other surface (e.g., back surface) of the solar cell 10 on the sealant 130. This is described more specifically.

In the present embodiment, the solar cell panel 100 includes a plurality of the solar cells 10. The plurality of solar cells 10 can be electrically connected by the wiring part 140 in series, in parallel or in a serial-parallel way. Specifically, the wiring part 140 can include a wiring material 142 at least part of which overlaps the first and second electrodes 42 and 44 of each solar cell 10 and is connected to the first and second electrodes 42 and 44, and a connection wiring 144 located in a direction that intersects with the wiring material 142 between the solar cells 10 and connected to the wiring material 142. The plurality of solar cells 10 can be connected in one direction (i.e., the x-axis direction in the drawing) by the wiring material 142 and the connection wiring 144 to form one column (i.e., solar cell string). Furthermore, the wiring part 140 can further include bus bar wirings located at both end of a solar cell string and configured to connect the solar cell string to another solar cell string or junction box (not shown).

Each of the wiring material 142, the connection wiring 144, and the bus bar wiring can include a conductive material (e.g., metal material). For example, each of the wiring material 142, the connection wiring 144, and the bus bar wiring can include a conductive core including any one of gold, silver, copper or aluminum and a conductive coating layer located on a surface of the conductive core and including tin or an alloy including tin. For example, the core can be made of copper. The conductive coating layer can be made of SnBiAg, that is, an alloy including tin. However, the disclosure is not limited thereto. The material, shape and connection structure of each of the wiring material 142, the connection wiring 144, and the bus bar wiring can be changed in various ways. Furthermore, adjacent solar cells 10a and 10b can be connected by only the wiring material 142 without separately using the connection wiring 144.

The sealant 130 can include a first sealant 131 located on the front surface of the solar cell 10 connected by the wiring part 140 and a second sealant 132 located on the back surface of the solar cell 10. The first sealant 131 and the second sealant 132 prevents the inflow of moisture and oxygen and chemically combines the elements of the solar cell panel 100. The first and second sealants 131 and 132 can be made of an insulating material having transparent and adhesive properties. For example, ethylene-vinyl acetate copolymer resin (EVA), polyvinyl butyral, silicon resin, ester resin or olefin resin can be used as the first sealant 131 and the second sealant 132. The second cover member 120, the second sealant 132, the solar cell 10, the wiring part 140, the first sealant 131, and the first cover member 110 can be integrated by a lamination process using the first and second sealants 131 and 132, thereby being capable of configuring the solar cell panel 100.

The first cover member 110 is located on the first sealant 131 to configure the front surface of the solar cell panel 100. The second cover member 120 is located on the second sealant 132 to configure the back surface of the solar cell 10. The first cover member 110 and the second cover member 120 can be made of an insulating material capable of protecting the solar cell 10 against various types of external impacts, moisture and ultraviolet rays. Furthermore, the first cover member 110 can be made of a transparent material through which light can pass. The second cover member 120 can be configured with a sheet made of a transparent material, a non-transparent material, or a reflection material. For example, the first cover member 110 can be configured with a glass substrate, and the second cover member 120 can be configured with a film or a sheet. The second cover member 120 can have a Tedlar/PET/Tedlar (TPT) type, and can include a poly vinylidene fluoride (PVDF) resin layer formed at least on one surface of a base film (e.g., polyethylene terephthalate (PET)).

However, the disclosure is not limited thereto. Accordingly, the first and second sealants 131 and 132, the first cover member 110, or the second cover member 120 can include various materials other than the above description, and can have various forms. For example, the first cover member 110 or the second cover member 120 can have various forms (e.g., substrate, film and sheet) or materials.

The wiring part 140 including the wiring material 142 is electrically connected to the solar cell 10 to enable an electrical connection to another solar cell 10 or an external circuit. In this case, in the present embodiment, the connection member CP is located at a portion that needs to be connected among a plurality of overlap parts in which the electrode 42, 44 and the wiring part 140 are overlapped between the electrode 42, 44 and the wiring part 140. The insulating member IP is located at a portion that does not need to be connected among the plurality of overlap parts between the electrode 42, 44 and the wiring part 140.

The first electrode 42 of the first solar cell 10a and the second electrode 44 of the second solar cell 10b adjacent to the first solar cell 10a can be connected by a plurality of the wiring materials 142 and the connection wirings 144.

In the present embodiment, the electrode 42, 44 includes a plurality of first and second electrodes 42 and 44 extended in one direction (i.e., y-axis direction in the drawing) and alternately located in a direction (i.e., x-axis direction in the drawing) that intersects with the one direction. Furthermore, the wiring material 142 can include a first wiring 142a extended in a second direction and electrically connected to the first electrode 42 and a second wiring 142b extended in the second direction and electrically connected to the second electrode 44. A plurality of the first wirings 142a is provided, and a plurality of the second wirings 142b is provided. The first wiring 142a and the second wiring 142b can be alternately located in the first direction. Accordingly, the plurality of first and second wirings 142a and 142b can be connected to the first and second electrodes 42 and 44 at uniform intervals, thus being capable of effectively transmitting carriers.

In this case, the first wiring 142a is electrically connected to the first electrode 42, provided in each solar cell 10, through the connection member CP. The second wiring 142b is electrically connected to the second electrode 44, provided in each solar cell 10, through the connection member CP. Furthermore, the first wiring 142a and the second electrode 44, and the second wiring 142b and the first electrode 42 can be insulated by the insulating member IP.

The connection member CP can include adhesive materials having various conductivities. For example, the connection member CP can be made of a material including a material included in the first and second electrodes 42 and 44 and/or the wiring material 142 or a mixed material of them. For example, the connection member CP can include a material of the first and second electrodes 42 and 44 and/or the wiring material 142 by a process of placing the wiring material 142 on the first or second electrode 42, 44 and applying heat. Alternatively, the connection member CP can include a solder paste layer including tin or an alloy including tin, an epoxy solder paste layer including epoxy resin including tin or an alloy including tin, etc. As described above, the connection member CP includes an adhesive material for physically fixing or attaching the electrode 42, 44 and the wiring material 142 like a solder or epoxy. Accordingly, the connection member CP can electrically and physically fix the electrode 42, 44 and the wiring material 142. For example, the connection member CP can be formed to come into contact with the electrode 42, 44 and the wiring material 142 and can physically and electrically connect the electrode 42, 44 and the wiring material 142.

The insulating member IP can be located between the first wiring 142a and the second electrode 44 that should not be electrically connected at least, and can electrically insulate them. Likewise, the insulating member IP can be located between the second wiring 142b and the first electrode 42 that should not be electrically connected at least, and can electrically insulate them. The insulating member IP can include various insulating materials. For example, the insulating member IP can include silicon resin, epoxy resin, urethane resin, acrylic resin, polyimide, and polyethylene.

In the present embodiment, the connection member CP is located between the second electrode part 42b, that is, the outermost layer of the electrode 42, 44, and the wiring part 140, so the wiring part 140 is fixed and electrically connected on the electrode 42, 44. In this case, the cover layer 428 of the second electrode part 42b and the connection member CP that come into contact with each other can include the same metal (e.g., tin, that is, the second metal), so an adhesion characteristic between the electrode 42, 44 and the wiring part 140 can be further improved.

Figure 11:
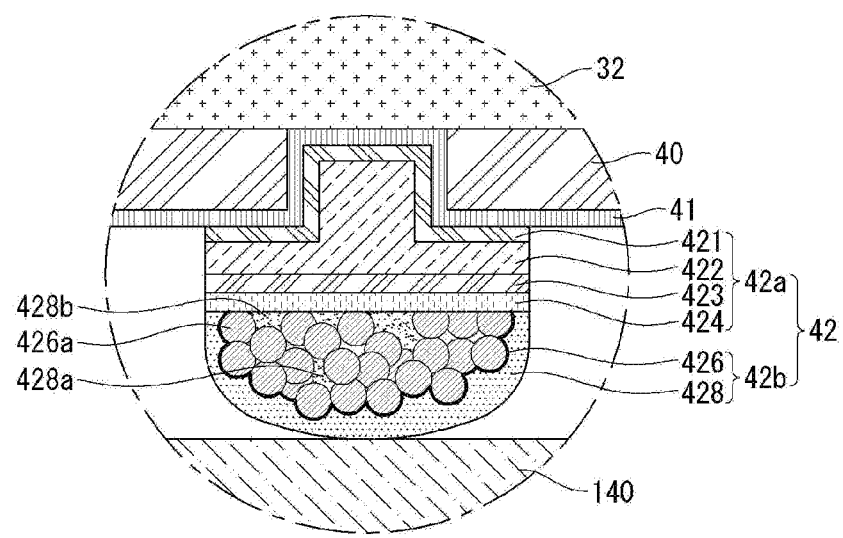
FIG. 11 is a partial cross-sectional view schematically showing another example of the connection structure of the solar cells, connection member and wiring part in the solar cell panel of FIG. 8.

In the above drawing, it has been illustrated that the electrode 42, 44 and the wiring part 140 are attached with the connection member CP interposed therebetween. However, if a solder material, such as tin, or a material included in the solder material is included in the second electrode part 42b, as shown in FIG. 11, the electrode 42, 44 and the wiring part 140 can be attached by applying heat in the state in which the wiring part 140 has been directly brought into contact with the cover layer 428 of the second electrode part 42b. Accordingly, a cost can be reduced and a process can be simplified because the connection member CP is not used.

The solar cell panel 100 according to the present embodiment includes the solar cell 10 having excellent characteristics and efficiency. The electrode 42, 44 and wiring part 140 of the solar cell 10 have an excellent adhesion characteristic. Accordingly, the solar cell panel 100 can have excellent output, excellent stability, and a low detect rate.

In the present embodiment, the second electrode part 42b can be formed to have various plane forms on the first electrode part 42a. Various plane forms of the second electrode part 42b are described in detail below with reference to FIG. 12.

Figure 12:
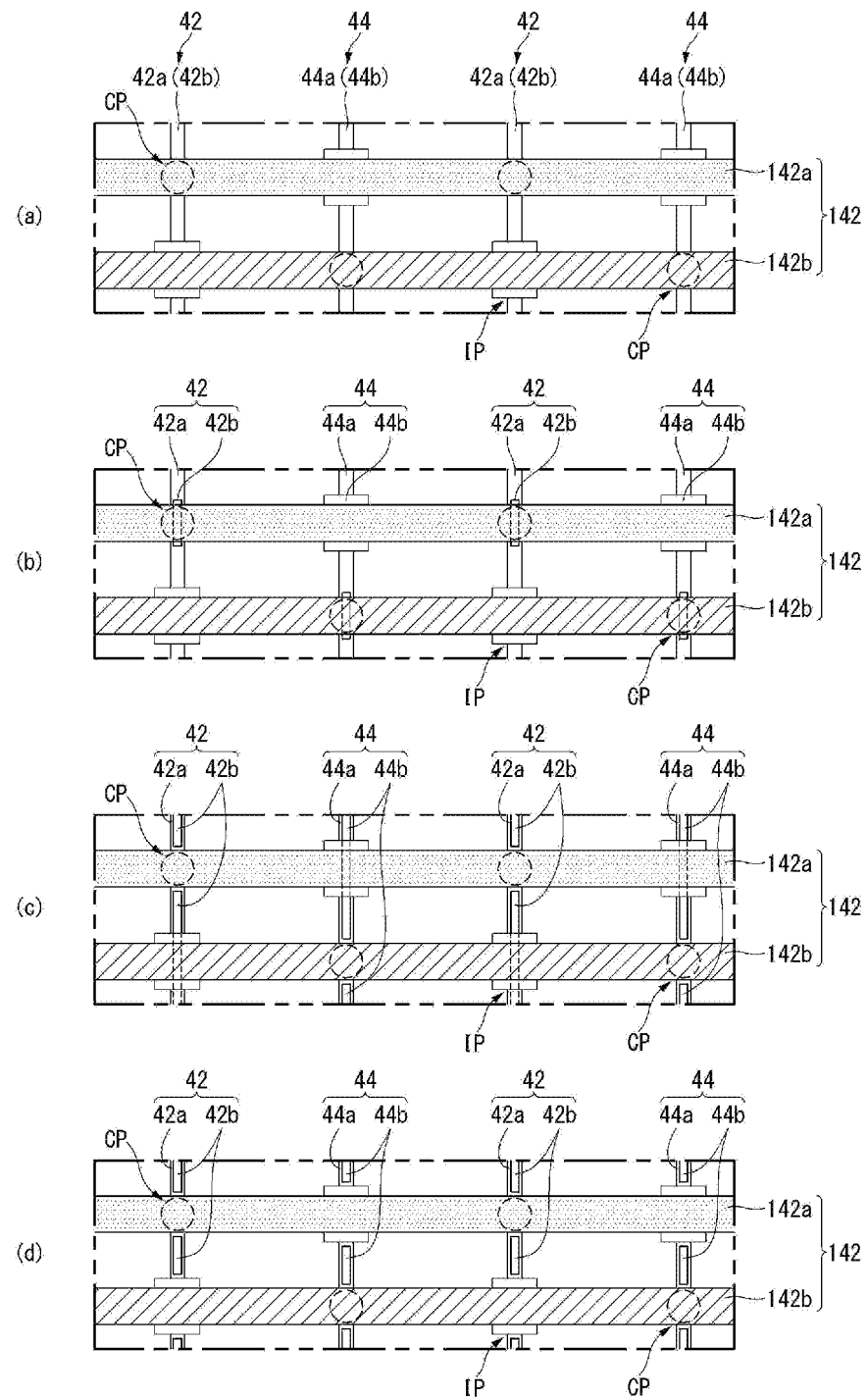
FIG. 12 is a plan view showing various examples of plane forms of first and second electrode parts in a solar cell according to an embodiment of the disclosure.

FIG. 12 is a plan view showing various examples of plane forms of first and second electrode parts in a solar cell according to an embodiment of the disclosure.

For example, as shown in FIG. 12(a), the first electrode part 42a, 44a and the second electrode part 42b, 44b can have a form in which they are lengthily connected generally and consecutively in the length direction of the first electrode 42, 44. Accordingly, the second electrode part 42b, 44b can effectively implement an effect by the second electrode part 42b, 44b by forming a sufficient area.

For another example, as shown in FIGS. 12(b) to 12(d), the first electrode part 42a, 44a can be generally and consecutively formed in the length direction of the first electrode 42, 44, the second electrode part 42b, 44b can be formed only in some of the length direction of the first electrode 42, 44, and the second electrode part 42b, 44b need not be formed in other portions of the length direction. For example, a plurality of the second electrode parts 42b, 44b can be provided at given intervals in the length direction so that they are isolated.

In this case, as shown in FIG. 12(b), the plurality of second electrode parts 42b, 44b can be provided in accordance with a portion formed at a portion connected or brought into contact with the connection member CP or the wiring part 140. Accordingly, an adhesion characteristic between the electrode 42, 44 and the connection member CP or the wiring part 140 can be improved by the second electrode part 42b, 44b because the connection member CP or the wiring part 140 is located at the portion where the second electrode part 42b, 44b has been formed.

Alternatively, as shown in FIG. 12(c), a plurality of the second electrode parts 42b, 44b can be provided in accordance with a portion except a portion where the second electrode part is connected or brought into contact with the connection member CP or the wiring part 140. Accordingly, the second electrode part 42b, 44b can include a plurality of portions isolated with the portion where the second electrode part is connected or brought into contact with the connection member CP or the wiring part 140 interposed therebetween. Accordingly, only the first electrode part 42a, 44a can be provided in the portion where the second electrode part is connected or brought into contact with the connection member CP or the wiring part 140, so structural stability can be improved at a portion to which the wiring part 140 is connected. Furthermore, the second electrode part 42b, 44b is generally formed at a portion except the portion to which the wiring part 140 is connected. When viewed in the length direction, the length of the portion where the second electrode part 42b, 44b is formed over the first electrode part 42a, 44a can be longer than the length of a portion where the second electrode part 42b, 44b is not formed. Accordingly, if the second electrode part 42b, 44b is partially formed, an effect by the second electrode part 42b, 44b can be effectively implemented because the second electrode part 42b, 44b can be formed in a sufficient length or area. For another example, a plurality of the second electrode parts 42b, 44b can be provided in accordance with portions except the insulating member IP.

Alternatively, as shown in FIG. 12(d), a plurality of the second electrode parts 42b, 44b can be provided in accordance with portions except a portion where the connection member CP, the insulating member IP and/or the wiring part 140 is located. Accordingly, the second electrode part 42b, 44b can include a plurality of portions isolated with the portion where the connection member CP, the insulating member IP and/or the wiring part 140 is located interposed therebetween. Accordingly, structural stability can be improved when the wiring part 140 is attached because only the first electrode part 42a, 44a is provided in a portion that involves a connection and insulating for the wiring part 140. Furthermore, the second electrode part 42b, 44b is generally formed in a portion except the corresponding portion. When viewed in the length direction, the length of the portion where the second electrode part 42b, 44b is formed can be equal to or greater than that of a portion where the second electrode part 42b, 44b is not formed over the first electrode part 42a, 44a. Accordingly, if the second electrode part 42b, 44b is partially formed, an effect by the second electrode part 42b, 44b can be effectively implemented because the second electrode part 42b, 44b can be formed in a sufficient length or area. However, the disclosure is not limited thereto. When viewed in the length direction, the length of the portion where the second electrode part 42b, 44b is formed can be smaller than that of a portion where the second electrode part 42b, 44b is not formed over the first electrode part 42a, 44a.

In each of the examples of FIG. 12, the second electrode part 42b of the first electrode 42 and the second electrode part 44b of the second electrode 44 have been illustrated as having the same or similar plane shape, but the disclosure is not limited thereto. That is, the second electrode part 42b of the first electrode 42 can have any one of the plane forms of FIGS. 12(a) to 12(d), and the second electrode part 44b of the second electrode 44 can have another of the plane forms of FIGS. 12(a) to 12(d). Other various modifications are possible.

In the above description, it has been illustrated that the first and second electrodes 42 and 44 are located on the back surface of the solar cell 10 and the first and second conductive regions 32 and 34 are provided as semiconductor layers different from the semiconductor substrate 12. However, the disclosure is not limited thereto. Another example is described in detail with reference to FIG. 13.

Figure 13:
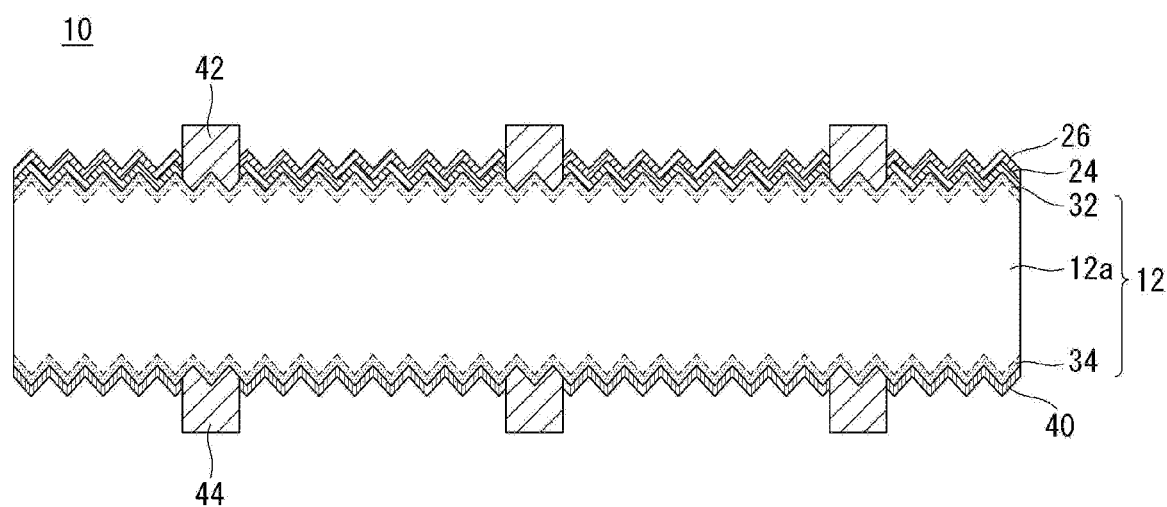
FIG. 13 is a cross-sectional view showing a solar cell according to another embodiment of the disclosure.

FIG. 13 is a cross-sectional view showing a solar cell according to another embodiment of the disclosure.

Referring to FIG. 13, in the solar cell 10 of the present embodiment, the first conductive region 32 and the first electrode 42 connected thereto are located on one surface of the semiconductor substrate 12, and the second conductive region 34 and the second electrode 44 connected thereto are located on the other surface of the semiconductor substrate 12. It has been illustrated that texturing structures are provided on both surfaces of the semiconductor substrate 12, but the disclosure is not limited thereto.

FIG. 13 illustrates that the first and second conductive regions 32 and 34 are doping regions formed by doping a dopant in some of the semiconductor substrate 12 at a concentration higher than that of the base region 12a. However, at least one of the first and second conductive regions 32 and 34 can be configured with a semiconductor layer different from the semiconductor substrate 12. In this case, the intermediate film (20 in FIG. 1) can be further located between the semiconductor substrate 12 and at least one of the first and second conductive regions 32 and 34. In this case, at least one of the first and second electrodes 42 and 44 can include the first and second electrode parts 42a and 42b of the above-described embodiment. The description of the first and second electrode parts 42a and 42b can be applied to the above case without any change, and a detailed description thereof is omitted.

In addition, at least one of the first and second electrodes 42 and 44 belongs to the range of the disclosure if it has the above-described structure regardless of the material, structure or form of the conductive region 32, 34, the structure or form of the solar cell 10, etc. Furthermore, the above various embodiments and modification examples can be combined, which also belongs to the range of the disclosure.

Hereinafter, the disclosure is described more specifically with reference to fabrication examples of the disclosure. However, the fabrication examples of the disclosure are merely illustrative, and the disclosure is not limited thereto.

FABRICATION EXAMPLE 1

An intermediate film configured with a silicon oxide film was formed on one surface of an n type single crystal semiconductor substrate. A semiconductor layer including polycrystal silicon was formed on a tunneling layer by low pressure chemical vapor deposition. Furthermore, semiconductor layers including a first conductive region and a second conductive region, respectively, were formed by doping a p type dopant in some region of the semiconductor layer and doping an n type dopant into another region the semiconductor layer. Furthermore, a back passivation film configured with a silicon nitride film and a silicon carbon film was formed. After a contact hole was formed, an insulating film configured with a titanium oxide film was formed within the contact hole and on the back passivation film. A first electrode and a second electrode electrically connected to the first conductive region and the second conductive region, respectively, on the insulating film through the contact hole were formed. In the process of forming the first and second electrodes, a first electrode part was formed by sequentially stacking a titanium film, an aluminum film, a titanium film and a nickel-vanadium alloy film by sputtering. A paste including a copper particle and a tin particle was coated on the first electrode part by printing. A second electrode part was formed by drying and annealing-heat treating the paste. A plurality of solar cells was fabricated using the same method.

COMPARATIVE EXAMPLE 1

A plurality of solar cells was fabricated using the same method as that of the fabrication example 1 except that each of the first and second electrodes included only the first electrode part because the second electrode part was not formed in the process of forming the first and second electrodes.

Figure 14:
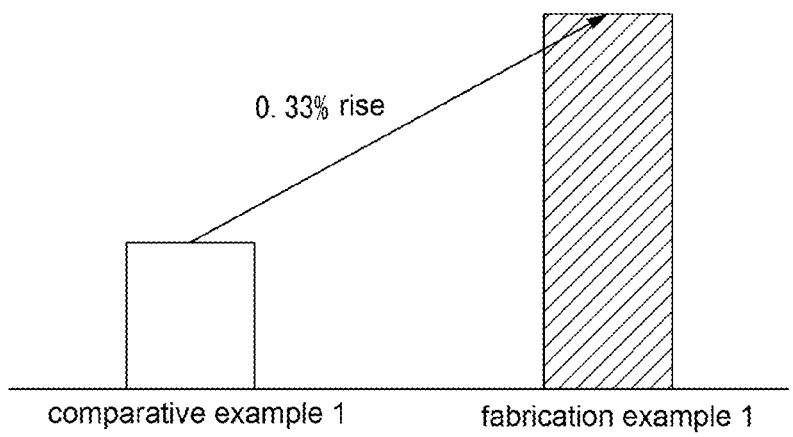
FIG. 14 is a graph showing the results of the measurement of full densities of a plurality of solar cells fabricated according to a fabrication example 1 and a comparative example 1.
Figure 15:
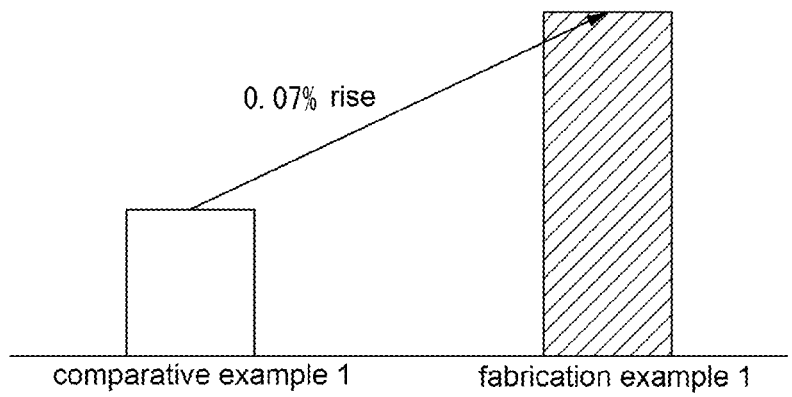
FIG. 15 is a graph showing the results of the measurement of efficiency of the plurality of solar cells fabricated according to the fabrication example 1 and the comparative example 1.

Full densities and efficiency of the plurality of solar cells fabricated according to the fabrication example 1 and the comparative example 1 were measured, and results thereof are shown in FIGS. 14 and 15.

Referring to FIGS. 14 and 15, it can be seen that the solar cell according to the fabrication example 1 has higher full density and higher efficiency than the solar cell according to the comparative example 1. More specifically, the solar cell according to the fabrication example 1 can have 0.33% higher full density than the solar cell according to the comparative example 1. It is estimated that resistance has been reduced by the second electrode part without degrading other characteristics. Accordingly, as illustrated in Table, it can be seen that the solar cell according to the fabrication example 1 has higher efficiency than the solar cell according to the comparative example 1. More specifically, the solar cell according to the fabrication example 1 can have 0.07% higher efficiency than the solar cell according to the comparative example 1.

The characteristics, structures, and advantages described in the embodiments are included in at least one of the embodiments of the disclosure, and the disclosure is not essentially limited to one embodiment. Furthermore, the characteristics, structures, and advantages illustrated in each of the embodiments can be combined with those of other embodiments or modified by those skilled in the art to which the embodiment belongs. Accordingly, contents related to the combinations and modifications should be construed as being included in the scope of the disclosure.

What is claimed is:

1. A solar cell comprising:
a semiconductor substrate;
a conductive region provided in the semiconductor substrate or on the semiconductor substrate; and
an electrode electrically connected to the conductive region,
wherein the electrode comprises a first electrode part and a second electrode part, the second electrode part being provided over the first electrode part, and
wherein the second electrode part comprises:
a particle connection layer formed by connecting a plurality of particles, each particle including a first metal, and
a cover layer including a second metal different from the first metal and covering at least an outside surface of the particle connection layer,
wherein the first electrode part comprises:
a first electrode layer including a refractory metal;
a second electrode layer provided on the first electrode layer and having lower resistance than the first electrode layer;
a third electrode layer formed on the second electrode layer and acting as a diffusion barrier; and
a fourth electrode layer provided on the third electrode layer and including tin or a nickel-vanadium alloy, and
wherein the second electrode part is provided to contact the fourth electrode layer.

2. The solar cell of claim 1, wherein the first metal has a resistance equal to or lower than a material of the first electrode part, and
wherein the second metal has a smaller ionization energy than the first metal or a lower reactivity of a metal than the first metal to prevent an oxidization of the first metal.

3. The solar cell of claim 2, wherein the second metal comprises a solder material having a lower melting point than the first metal.

4. The solar cell of claim 1, wherein the first metal comprises at least one of copper, silver, aluminum, or gold, and
wherein the second metal comprises at least one of tin, chrome, manganese, molybdenum or nickel.

5. The solar cell of claim 4, wherein the first metal comprises copper, and
wherein the second metal comprises tin.

6. The solar cell of claim 1, wherein the second electrode part configures an outermost layer of the electrode, and
wherein the second electrode part has lower density than the first electrode part.

7. The solar cell of claim 1, wherein a ratio of a thickness of the second electrode part to a thickness of the first electrode part is about 10 or more.

8. The solar cell of claim 7, wherein a first thickness of the particle connection layer is greater than a second thickness of the cover layer in a portion provided on the outside surface of the particle connection layer.

9. The solar cell of claim 8, wherein a ratio of the second thickness to the first thickness is 0.04 to 0.2.

10. The solar cell of claim 1, wherein a thickness of the cover layer is greater than a surface roughness of the outside surface of the particle connection layer.

11. The solar cell of claim 1, wherein a surface roughness of an outside surface of the cover layer is smaller than a surface roughness of the outside surface of the particle connection layer.

12. The solar cell of claim 1, wherein a width of the second electrode part is equal to or smaller than a width of the first electrode part.

13. The solar cell of claim 12, wherein the second electrode part is formed on a surface of the first electrode part provided opposite the semiconductor substrate and is not formed on a side of the first electrode part in a direction intersecting the semiconductor substrate.

14. The solar cell of claim 1, wherein the first electrode layer includes titanium, wherein the second electrode layer includes aluminum, wherein the third electrode layer includes titanium, and wherein the fourth electrode layer includes the nickel-vanadium alloy.

15. The solar cell of claim 1, wherein the conductive region comprises:
a first conductive region provided on one surface of the semiconductor substrate and having a first conductive type, and a second conductive region provided in a position different from a position of the first conductive region on the one surface of the semiconductor substrate, the second conductive region having a second conductive type,
wherein the electrode comprises a first electrode connected to the first conductive region and a second electrode connected to the second conductive region, and
wherein at least one of the first electrode and the second electrode comprises the first electrode part and the second electrode part.

\* \* \* \* \*